(12) United States Patent
Pahlevaninezhad et al.

(10) Patent No.: US 11,959,625 B2
(45) Date of Patent: Apr. 16, 2024

(54) HIGH-PERFORMANCE HIGH-POWER LED LIGHTING SYSTEMS AND METHODS THEREOF

(71) Applicant: 10644137 CANADA INC., Calgary (CA)

(72) Inventors: Hamid Pahlevaninezhad, Calgary (CA); Majid Pahlevaninezhad, Calgary (CA); Sam Scherwitz, Calgary (CA); Dawood Shekari Beyragh, Calgary (CA)

(73) Assignee: 10644137 CANADA INC., Calgary (CA)

( * ) Notice: Subject to any disclaimer, the term of this patent is extended or adjusted under 35 U.S.C. 154(b) by 0 days.

(21) Appl. No.: 17/260,216

(22) PCT Filed: Jul. 15, 2019

(86) PCT No.: PCT/CA2019/050974
§ 371 (c)(1),
(2) Date: Jan. 13, 2021

(87) PCT Pub. No.: WO2020/010473
PCT Pub. Date: Jan. 16, 2020

(65) Prior Publication Data
US 2021/0262651 A1    Aug. 26, 2021

Related U.S. Application Data

(60) Provisional application No. 62/861,531, filed on Jun. 14, 2019, provisional application No. 62/715,637, (Continued)

(51) Int. Cl.
*F21V 29/76* (2015.01)
*A01G 7/04* (2006.01)
(Continued)

(52) U.S. Cl.
CPC .............. *F21V 29/763* (2015.01); *F21V 5/04* (2013.01); *F21V 29/83* (2015.01); *A01G 7/045* (2013.01);
(Continued)

(58) Field of Classification Search
CPC ......... A01G 7/045; F21V 5/04; F21V 29/763; F21V 29/83
See application file for complete search history.

(56) References Cited
U.S. PATENT DOCUMENTS 6,874,911 B2 * 4/2005 Yoneda ................... F21V 15/01
                                                          362/547
7,458,706 B1 * 12/2008 Liu ......................... F21V 29/75
                                                          362/547
(Continued)

FOREIGN PATENT DOCUMENTS

CN    103244925 A    8/2013
CN    106885152 A    6/2017
(Continued)

OTHER PUBLICATIONS

International Search Report and Written Opinion dated Oct. 18, 2019 for PCT Application PCT/CA2019/050974 filed on Jul. 15, 2019.

*Primary Examiner* — Arman B Fallahkhair
(74) *Attorney, Agent, or Firm* — Osha Bergman Watanabe & Burton LLP

(57) ABSTRACT

A Light-Emitting Diode (LED) light apparatus has a housing and a printed circuit board (PCB) received in the housing. The PCB has one or more first openings and one or more LEDs on a front side thereof about the first openings. The housing has a rear-wall structure with a plurality of fins spaced from each other and one or more second openings at locations corresponding to those of the first openings for heat management. The LED light apparatus may also have (Continued)

a plurality of rotatable LED panels having PCBs and LEDs thereon. The LED panels are spaced from each other with gaps therebetween for heat management, and are rotatable for controlling light distribution, light angular-span, and light direction. A LED grow-light system uses a light-distribution structure such as reflectors and/or fiber-optic cables for distributing at least a portion of the light towards the plant.

39 Claims, 18 Drawing Sheets

Related U.S. Application Data filed on Aug. 7, 2018, provisional application No. 62/697,530, filed on Jul. 13, 2018.

(51) Int. Cl.
*F21V 5/04* (2006.01)
*F21V 29/83* (2015.01)
*F21W 131/40* (2006.01)
*F21Y 105/16* (2016.01)
*F21Y 115/10* (2016.01)

(52) U.S. Cl.
CPC ...... *F21W 2131/40* (2013.01); *F21Y 2105/16* (2016.08); *F21Y 2115/10* (2016.08)

(56) References Cited

U.S. PATENT DOCUMENTS

| | | | | |
|---|---|---|---|---|
| 7,997,769 B2* | 8/2011 | Foo | .......................... | F21V 29/89 362/345 |
| 8,066,414 B2* | 11/2011 | Pabst | ...................... | F21V 29/67 362/345 |
| 8,777,455 B2* | 7/2014 | Pickard | ................... | F21K 9/233 362/241 |
| 8,783,937 B2* | 7/2014 | Steedly | ................. | F21V 29/506 362/249.02 |
| 8,915,616 B2* | 12/2014 | Jeon | ....................... | F21V 31/03 362/249.02 |
| 8,994,273 B2 | 3/2015 | Kornitz et al. | | |
| 9,182,110 B2 | 11/2015 | Kadijk et al. | | |
| 10,197,262 B2* | 2/2019 | Sohn | ..................... | F21V 29/763 |
| 10,330,303 B2* | 6/2019 | Kwak | ....................... | F21K 9/00 |
| 10,354,938 B2* | 7/2019 | Bilan | ..................... | F21V 29/76 |
| 10,378,749 B2* | 8/2019 | Progl | .................... | F21V 29/506 |
| 2005/0258446 A1 | 11/2005 | Raos et al. | | |
| 2006/0127010 A1 | 6/2006 | Allen | | |
| 2009/0196037 A1* | 8/2009 | Xiao | ....................... | F21V 21/30 362/427 |
| 2011/0115385 A1 | 5/2011 | Waumans et al. | | |
| 2012/0033419 A1* | 2/2012 | Kim | ...................... | F21V 29/773 362/294 |
| 2012/0194082 A1 | 8/2012 | Huang et al. | | |
| 2013/0000185 A1 | 1/2013 | Tanase et al. | | |
| 2013/0223069 A1 | 8/2013 | Kim et al. | | |
| 2014/0218909 A1 | 8/2014 | Tetsuo et al. | | |
| 2015/0128489 A1 | 5/2015 | Yamada et al. | | |
| 2017/0188531 A1 | 7/2017 | Daniels | | |
| 2017/0311553 A1 | 11/2017 | Dobrinsky et al. | | |
| 2018/0209636 A1 | 7/2018 | Sohn et al. | | |
| 2018/0252401 A1 | 9/2018 | Yu et al. | | |

FOREIGN PATENT DOCUMENTS

| | | |
|---|---|---|
| WO | 2012135173 A1 | 10/2012 |
| WO | 2017060800 A1 | 4/2017 |

* cited by examiner

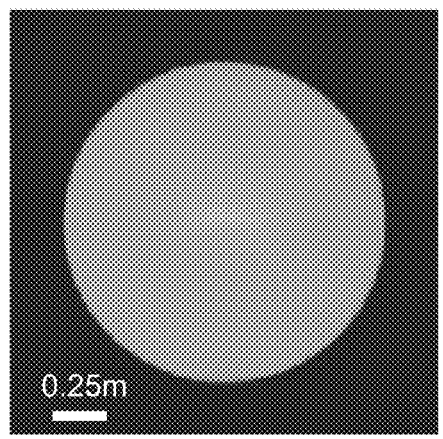 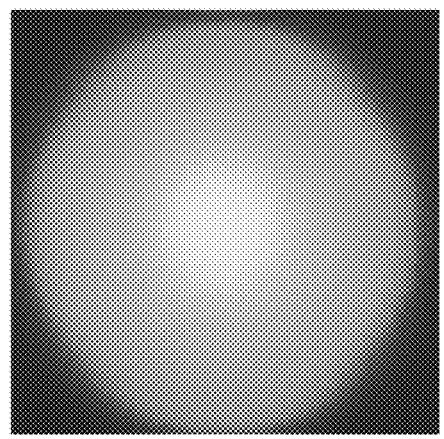 
FIG. 37A      FIG. 37B      FIG. 37C
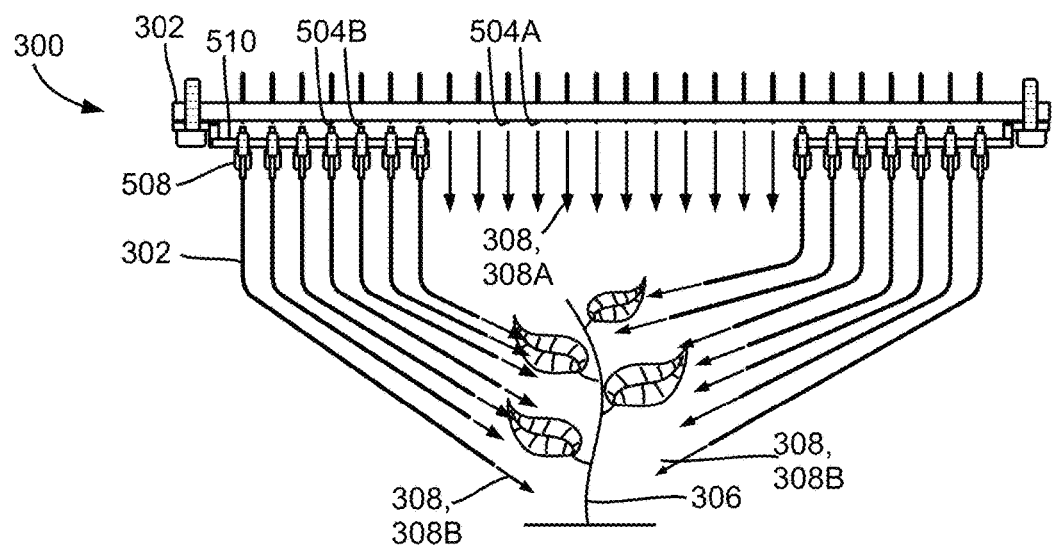
FIG. 38

HIGH-PERFORMANCE HIGH-POWER LED LIGHTING SYSTEMS AND METHODS THEREOF

CROSS-REFERENCE TO RELATED APPLICATIONS

This application claims the benefit of U.S. Provisional Patent Application Ser. No. 62/697,530 filed Jul. 13, 2018, 62/715,637 filed Aug. 7, 2018, and 62/861,531 filed Jun. 14, 2019, the content of each of which is incorporated herein by reference in its entirety.

FIELD OF THE DISCLOSURE

The present disclosure relates to high-performance high-power Light-Emitting Diode (LED) lighting systems and methods, and in particular to systems, apparatuses, and methods for high-power LED lights with light control and heat management, and applications thereof in various areas such as illumination and plant-growing.

BACKGROUND

Light-Emitting Diodes (LEDs) are known and have been widely used in many industries, mostly as low-power light indicators. In recent years, LEDs with increased power output or increased luminous intensity have been developed and used for illumination. For example, with improved energy efficiency, safety, and reliability, LED lights are replacing other types of lights in the market such as incandescent lights, Compact Fluorescent Lamps (CFLs), and the like. As everyday lighting significantly contributes to the burden on power grids and greatly increases the overall requirements for electricity generation, the energy efficiency of LEDs will play a crucial role in future energy savings. It is likely that LEDs will dominate the lighting markets because of their superior energy efficiency.

With the advantages such as higher efficiency, high-light intensity, and the like, LEDs with increased power output and/or increased luminous intensity have also been used as light sources in various areas such as plant growing, environmental illumination, and the like.

In plant-growing applications, the LED light sources, which are sometimes called LED grow lights, provide various advantages such as producing precisely selected wavelengths of lights, high intensity illumination, high energy-efficiency illumination, and the like. LED grow lights are also advantageous for indoor plant growing as the process of growing plants can be performed in controlled environments with much less risks and other unwanted outdoor variables.

Light is of great importance to the plant growth. In fact, competition for sunlight is the underlying cause of the consistent pattern of tree sizes in rainforests around the globe (see Reference 1). In multilayer plants, outermost leaves lean as much as possible to receive sunlight. However, leaves at the lower portions of the plants or in the shadow of other leaves may not have direct lines-of-sight with respect to an illumination source such as the sun, and may only receive insufficient light. Symptoms caused by insufficient illumination include yellowing of lower-plant leaves, pale color, small leaves, thin stem, and poor growth. Therefore, the distribution of light about the plant has great influence to the plant's health and growth.

The plant growth occurs as a result of "photosynthesis" processes. As known in the art, the photosynthesis processes convert carbon dioxide ($CO_2$) into organic compounds using energy from the light. Specifically, the light energy is absorbed through special proteins containing chlorophyll pigments that exist in photosynthetic cell membranes called chloroplasts. The photosynthetic cells are mainly in plant leaves.

However, chlorophyll only absorbs energy from particular parts or colors of the light spectrum. The effective spectra are across the blue and red color spectra. The green part of the light spectrum is reflected, which is why plant leaves are usually in green color. When photosynthetic cells in leaves die and the chlorophyll is degraded, other pigmented molecules in the leaves dominate light reflection while they are degraded to the point where the leaves only exhibit brown colors.

Thus, it is known that different pigments in chloroplasts absorb specific wavelengths of light to contribute to photosynthesis, and the photosynthetic efficiency or rate has strong correlation with the spectrum of illumination. A review of the photosynthesis under various illumination conditions is described in Applicant's PCT Application No. PCT/CA2018/050522, entitled "METHOD OF GROWING PLANTS USING LED LIGHT AND LED LIGHT SYSTEM EMPLOYING SAME", to Majid PAHLEVANI-NEZHAD, et al., filed on May 2, 2018, the content of which is incorporated herein by reference in its entirety.

For example, rice plants grown under blue and red illumination have higher photosynthesis efficiency than those grown under only red illumination. Pea leaves grown under red LED light contain higher levels of β-carotene than those grown under blue or white LED light.

Light intensity is another influential factor in photosynthesis due to the response of photosynthesis organisms to high-light intensity to reduce stress effects. Under red LED light, wheat seedlings accumulate chlorophyll at 100 μmol $m^{-2}s^{-1}$, but not at 500 μmol $m^{-2}s^{-1}$.

It is observed that plants usually absorb the blue light spectra during their early growth, and then increasingly absorb the red light spectra as they mature and during their blooming phase. The geometry of illumination such as the distance between the light sources and the plant, also affects the light energy that can be absorbed by the plant and the associated photosynthesis efficiency thereof. Usually, the available energy decreases at a rate proportional to the square of the distance between the light and the plant. In addition, plants are capable of sensing duration of lighting period and time, and change their growth rates accordingly.

Plant cultivation using constant illumination is neither energy efficient nor optimal for photosynthesis. As prior-art LED grow lights usually provide light for the plants without consideration for the aforementioned factors, they fail to provide appropriate color spectra with appropriate intensities at appropriate times in order to optimize the physiological processes of growing plants. Moreover, different plants require different light characteristics (for example, intensity, spectrum, time, and the like) to achieve the best growth performance. However, prior-art LED grow lights fail to adapt to the plant needs and fail to provide appropriate light characteristics.

FIG. 1 is a block diagram of a typical prior-art LED grow-light system 10. As shown, the LED grow-light system 10 comprises a plurality of LED light apparatuses 12 emitting light 14 towards plants 16 for facilitating their growth. The LED light apparatuses 12 are usually located at fixed positions, for example such as mounted to the ceiling of a room.

FIG. 2 shows the LED light apparatus 12. As shown, the LED light apparatus 12 comprises a frame 18 made of a rigid material, a printed circuit board (PCB) 20 mounted on the frame 18 and comprising necessary circuitry (not shown) and a plurality of LEDs 22 for emitting light 14.

FIG. 3 is a block diagram showing the electrical components of the prior-art LED grow-light system 10. As shown, the LED grow-light system 10 comprises an Alternate Current (AC) to Direct Current (DC) converter (AC/DC converter) 24 for converting the AC power from an AC power source 26 such as an AC grid, to a DC power, and using the DC power to drive the LEDs 22 of the LED light apparatuses 12.

There are various challenges and difficulties related to the prior-art LED grow-light systems. For example, plants require specific types of light spectra for specific periods of time throughout their growth process. However, prior-art LED grow-light systems do not provide light spectra configurations that are best suitable for optimal plant growth at different stages throughout the growth cycle.

As another example, the LEDs used in prior-art LED grow-light systems are often unable to provide adequate light intensity of the light spectra required for optimal plant growth performance. Therefore, the LED grow-light systems are usually energy inefficient with significant energy wasted in the form of heat.

As yet another example, in prior-art LED grow-light systems, LED light sources are usually mounted at fixed positions. Therefore, the prior-art LED grow-light systems usually do not have the capability for adjusting and optimizing the distances between the LED light sources and the plants at different stages of their growth.

Systems for optimizing photosynthesis are also known. However, these systems do not take into account all illumination parameters in photosynthesis optimization. Some of the photosynthesis optimization systems focus only on the wavelength of the illumination, and others focus only on the amplitude of the illumination. There is some prior art that considers more than one aspect of illumination.

Photosynthetic efficiency strongly depends on all illumination parameters. Moreover, the effects of illumination parameters on photosynthetic efficiency are interrelated (that is, they are not independent from each other). However, none of the prior-art photosynthesis optimization systems takes into account all aspects of illumination.

In addition to above-described disadvantages, prior-art LED grow-light systems also have some other drawbacks. For example, as shown in FIG. 4 and known in the art, a LED 22 has a fixed angular span 32 of light 14. However, different types of LEDs generally have different light angular-spans. Based on the application, a suitable LED type has to be selected to provide the desired light angular-span. Such a selection requirement usually causes significant burdens to the manufacturing as manufacturers have to make different designs for different applications and at present, cannot use a universal solution.

Referring again to FIG. 2, as the PCB 20 and the LEDs 22 are fixed on the frame 18, the light 14 emitted from each LED 22 is of a fixed direction with a fixed angular span. When LEDs 22 with different light angular-spans are used, the light distribution of the LED light apparatus 12, which is the aggregation of the light emitted from all LEDs 22, is non-uniform with respect to the light-emission plane (e.g., the plane of the LEDs 22), as illustrated in FIG. 5.

Moreover, in prior-art LED light apparatuses 12, the light 14 is usually emitted from the LEDs 22 at a fixed direction and cannot be rotated to change their light direction or illumination area.

The illumination situation becomes more complicated in a plant-growing site. For example, the above-described insufficient illumination issue may also be caused by shading or light-blocking between leaves of a plant and more significantly between leaves of a multilayered plant.

As the illumination source of a growing site is usually located at an elevation higher than the height of the plants in the site, light emitted from the illumination source usually illuminates the plants from thereabove. Consequently, lower parts of the plants may not receive sufficient light. Moreover, in prior-art LED grow-light systems, light emitted from a typical LED may be highly divergent. Therefore, a portion of the light rays emitted from the LED may not illuminate any plant thereby wasting the light energy that may otherwise be used for facilitating the growth of the plants.

In the plant-growing area, the light sources are usually high-power light sources in order to provide the plants sufficient light energy. With increased power consumption of LED grow lights, heat management becomes a critical issue compared to traditional applications that use low-power LEDs. However, the power architecture of prior-art LED grow-light systems is not optimal for highly efficient operations as they usually require large heat-sinks and/or forced-convection cooling one or more fans to dissipate the heat generated by the LEDs for achieving an effective thermal performance and safe operations.

FIG. 6 is a schematic diagram showing a prior-art LED light apparatus 12 using forced-convection cooling. The LED light apparatus 12 comprises a PCB 20 coupled to an enclosure 42. The PCB 20 comprises a plurality of LEDs 22 thereon for light emission. The enclosure 42 comprises therein an intake fan 44 and an exhaust fan 46 mounted to or adjacent an inlet and an outlet, respectively, at opposite ends thereof. The intake fan 44 introduces cool airflow 48 into the enclosure 42. While flowing in the enclosure 42, the airflow 48 is heated up through heat exchange with the PCB 20 and the warm airflow 48 is forced out of the enclosure 42 by the exhaust fan 46. The PCB 20 is thus maintained at a lowered temperature.

Such prior-art LED grow lights have several drawbacks. For example, the operation of fans 44 and 46 consumes a significant amount of power and is a source of noise. Moreover, the fans 44 and 46 are prone to failure over time thereby eventually causing the LED light apparatus 12 to fail. The enclosure 42 is also susceptible to failure due to ingression of water, moisture, dust, and the like.

With the aforementioned challenges, prior-art LED grow-light systems cannot provide optimal solutions for facilitating plant growth. Since plant growth is a relatively lengthy process, un-optimized growth light systems significantly increase the operation costs and overall inefficiencies of the systems.

As described above, LEDs have also been used for environmental illumination. Prior-art LED lights used in this area also have disadvantages similar to some of those described above, such as the non-uniform light distribution, nonadjustable light direction, and nonadjustable angular span. In many illumination applications such as those for highways and warehouses, LEDs as illumination sources generally require high-luminous intensities, and thus usually requires much higher power compared to LEDs for other applications such as residential lighting applications. Therefore, prior-art high-power LED lights for environmental illumination also have above-described drawbacks in their heat management.

SUMMARY

According to one aspect of this disclosure, there is provided an apparatus capable of using heat convection for dissipating heat generated during operation. The apparatus comprises: one or more printed circuit boards (PCBs), at least a first one of the one or more PCBs comprising one or more first openings; and a housing receiving the one or more PCBs therein. The housing comprise one or more second openings for collaborating with the one or more first openings for dissipating heat via heat convection.

In some embodiments, the apparatus further comprises: one or more Light-Emitting Diodes (LEDs) distributed on the at least first one of the one or more PCBs about the one or more first openings.

In some embodiments, the one or more first openings are elongated openings.

In some embodiments, the housing comprises a rear-wall structure on a rear side thereof, the rear-wall structure comprising the one or more second openings.

In some embodiments, at least a pair of the one or more first openings and the one or more second openings are overlapped at a vertical direction between a front side and the rear side of the housing.

In some embodiments, the rear-wall structure is made of a thermal-conductive material.

In some embodiments, the at least first one of the one or more PCBs is in thermal contact with the rear-wall structure.

In some embodiments, the at least first one of the one or more PCBs is in thermal contact with the rear-wall structure via a layer of thermal-conductive potting material sandwiched therebetween.

In some embodiments, the rear-wall structure further comprises a plurality of fins equidistantly spaced apart from each other.

In some embodiments, a first set of the plurality of fins extend between an opposite pair of edges of the rear-wall structure; and a second set of the plurality of fins extend front an outermost fin of the first set of the plurality of fins towards an edge of the rear-wall structure adjacent the outermost fin.

In some embodiments, the rear-wall structure further comprises a base; the plurality of fins extend outwardly from the base; and the base comprises the one or more second openings.

In some embodiments, the one or more second openings are at locations corresponding to the one or more first openings.

In some embodiments, spaces between the plurality of fins form the one or more second openings.

In some embodiments, at least a second one of the one or more PCBs comprises a conformal coating layer on an exterior side thereof.

In some embodiments, the at least second one of the one or more PCBs is the at least first one of the one or more PCBs.

In some embodiments, the housing comprises a front wall for enclosing the one or more PCBs therebehind; and the front wall comprises one or more third openings for collaborating with the one or more first openings and the one or more second openings for dissipating heat via heat convection.

In some embodiments, the front wall comprises a lens structure having one or more lenses.

In some embodiments, the one or more third openings are elongated openings.

In some embodiments, the housing comprises a first portion for receiving at least a third one of the one or more PCBs, and a second portion for receiving at least one or more additional components; and the second portion of the housing has a depth larger than that of the first portion thereof.

In some embodiments, the second portion of the housing receives therein at least a fourth one of the one or more PCBs.

In some embodiments, the at least fourth one of the one or more PCBs comprises one or more fourth openings.

In some embodiments, the housing comprises one or more fifth openings in the second portion.

According to one aspect of this disclosure, there is provided a LED light apparatus comprising: a housing; and one or more PCBs received in the housing. The at least one PCB comprises one or more first openings and one or more LEDs on a front side thereof about the one or more first openings.

In some embodiments, the one or more first openings are elongated openings.

In some embodiments, the housing comprises a plurality of sidewalls and a rear-wall structure, the rear-wall structure comprising one or more second openings; and at least one pair of the one or more first openings and the one or more second openings are at corresponding locations.

In some embodiments, the at least one pair of the one or more first openings and the one or more second openings are overlapped at a vertical direction between a front side and the rear side of the housing.

In some embodiments, a back of at least one of the one or more PCBs is in thermal contact with the rear-wall structure of the housing.

In some embodiments, the rear-wall structure further comprises a plurality of fins spaced from each other.

In some embodiments, the rear-wall structure further comprises a base; the plurality of fins extend outwardly from the base; and the base comprises the one or more second openings.

In some embodiments, spaces between the plurality of fins form the one or more second openings.

According to one aspect of this disclosure, there is provided a method for dissipating heat generated in an apparatus during operation, the apparatus comprising a housing and one or more printed circuit boards (PCBs) received therein The method comprises: establishing one or more first openings on at least a first one of the one or more PCBs; and establishing one or more second openings on the housing for collaborating with the one or more first openings for dissipating heat via heat convection.

In some embodiments, the method further comprises: distributing one or more Light-Emitting Diodes (LEDs) on the at least first one of the one or more PCBs about the one or more first openings.

In some embodiments, said establishing the one or more first openings on the at least first one of the one or more PCBs comprises: establishing the one or more elongated first openings on the at least first one of the one or more PCBs.

In some embodiments, said establishing the one or more second openings on the housing comprises: establishing the one or more second openings on a rear-wall structure on a rear side of the housing.

In some embodiments, said establishing the one or more second openings on the rear-wall structure of the housing comprises: establishing the one or more second openings on the rear-wall structure of the housing with at least a pair of the one or more first openings and the one or more second openings overlapped at a vertical direction between a front side and the rear side of the housing.

In some embodiments, the rear-wall structure is made of a thermal-conductive material, and the method further comprises: arranging the at least first one of the one or more PCBs in thermal contact with the rear-wall structure.

In some embodiments, said arranging the at least first one of the one or more PCBs in thermal contact with the rear-wall structure comprises: sandwiching a layer of thermal-conductive potting material between the at least first one of the one or more PCBs and the rear-wall structure.

In some embodiments, the method further comprises: arranging a plurality of fins on the rear-wall structure and equidistantly spaced apart from each other.

In some embodiments, said arranging the plurality of fins on the rear-wall structure and equidistantly spaced apart from each other comprises: arranging a first set of the plurality of fins extend between an opposite pair of edges of the rear-wall structure; and arranging a second set of the plurality of fins extend front an outermost fin of the first set of the plurality of fins towards an edge of the rear-wall structure adjacent the outermost fin.

In some embodiments, said arranging the plurality of fins on the rear-wall structure and equidistantly spaced apart from each other comprises: establishing the one or more second openings on a base of the rear-wall structure; and extending the plurality of fins outwardly from the base of the rear-wall structure.

In some embodiments, said establishing the one or more second openings on the base of the rear-wall structure comprises: establishing the one or more second openings on the base of the rear-wall structure at locations corresponding to the one or more first openings.

In some embodiments, said establishing one or more second openings on the housing comprises: arranging the plurality of fins on the rear-wall structure and equidistantly spaced apart from each other with spaces between the plurality of fins forming the one or more second openings.

In some embodiments, the method further comprises: coating at least a second one of the one or more PCBs with a conformal coating layer on an exterior side thereof.

In some embodiments, the at least second one of the one or more PCBs is the at least first one of the one or more PCBs.

In some embodiments, the method further comprises: establishing one or more third openings on a front wall of the housing for collaborating with the one or more first openings and the one or more second openings for dissipating heat via heat convection.

In some embodiments, said establishing the one or more third openings on the front wall of the housing comprises: establishing the one or more elongated third openings on the front wall of the housing.

According to one aspect of this disclosure, there is provided a LED light apparatus comprising: a frame; and a plurality of first LED panels rotatably coupled to the frame with gaps between adjacent first LED panels and between the frame and the adjacent ones of the plurality of first LED panels. Each first LED panel comprises a printed circuit board (PCB) and one or more first LEDs thereon.

In some embodiments, the LED light apparatus further comprises: one or more second LED panels non-rotatably coupled to the frame, each second LED panel comprising one or more second LEDs thereon.

In some embodiments, at least one of the first and second LEDs is rotatably coupled to a microelectromechanical-structure (MEMS) component thereby forming a LED assembly for adjusting light-emission angle hereof under the control of the MEMS component.

In some embodiments, at least one of the first and second LED panels comprises a plurality of LED assemblies printed onto the LED panel.

In some embodiments, each of the plurality of first LED panels is rotatable about at least one axis; and the axes of the plurality of first LED panels are in parallel with each other.

In some embodiments, each of the plurality of first LED panels is rotatable within a predefined angular range.

In some embodiments, at least one of the plurality of first LED panels further comprises a heat sink coupled to a backside of the PCB thereof.

In some embodiments, the heat sink comprises a plurality of first openings for heat convection.

In some embodiments, the PCB of the at least one of the plurality of first LED panels comprises one or more second openings at locations corresponding to the plurality of first openings for heat convection.

In some embodiments, the heat sink comprises a plurality of fins.

In some embodiments, the plurality of fins comprise one or more elongate fins.

In some embodiments, the LED light apparatus further comprises: a multi-output power circuit for receiving an alternate-current (AC) power and converting received AC power to a plurality of direct current (DC) outputs. The PCB of each of the plurality of first LED panels is individually powered by one of the plurality of DC outputs.

In some embodiments, the LED light apparatus further comprises: at least one of one or more sensors and a communication interface; and a control circuitry. The control circuitry is configured for: receiving data from the at least one of the one or more sensors and the communication interface, and adjusting an operation of the plurality of first LED panels based on the received data.

In some embodiments, the one or more sensors comprises at least one of a motion sensor and a light sensor.

In some embodiments, said adjusting the operation of the plurality of first LED panels comprises at least one of: (i) adjusting a light intensity of the plurality of first LED panels; (ii) adjusting the angles of the plurality of first LED panels for adjusting a light distribution of the LED light apparatus; (iii) adjusting the angles of the plurality of first LED panels for adjusting a light direction of the LED light apparatus; (iv) adjusting the angles of the plurality of first LED panels for adjusting a light angular-span of the LED light apparatus; and (v) adjusting the angles of the plurality of first LED panels for adjusting an illumination area of the LED light apparatus.

In some embodiments, said adjusting the angles of the plurality of first LED panels for adjusting a light distribution of the LED light apparatus comprises: adjusting the angles of the plurality of first LED panels for achieving a uniform light distribution with respect to a reference plane.

In some embodiments, the one or more sensors comprises a light sensor for measuring the light distribution of the LED light apparatus; and the control circuitry is configured for adjusting the angles of the plurality of first LED panels for adjusting a light distribution of the LED light apparatus, based on the light-distribution measurement received from the light sensor.

In some embodiments, at least one of the plurality of first LED panels is rotatable about at least two perpendicular axes.

According to one aspect of this disclosure, there is provided a method for controlling a Light-Emitting Diode (LED) light apparatus having a plurality of LEDs. The method comprises: arranging the plurality of LEDs onto a plurality of rotatable first LED panels; and rotating the plurality of rotatable first LED panels for controlling one or more characteristics of the LED light apparatus.

In some embodiments, the one or more characteristics comprise at least one of: a light distribution, a light direction, a light angular-span, and an illumination area.

According to one aspect of this disclosure, there is provided a lighting system for facilitating the growth of a plant. The system comprises: an illumination source for emitting a light absorbable by the plant; and a light-distribution structure coupled to the illumination source for distributing at least a portion of the light emitted from the illumination source towards the plant.

In some embodiments, said illumination source comprises a plurality of LEDs.

In some embodiments, a first portion of the LEDs are configured for emitting light directly towards the plant; and a second portion of the LEDs are configured for coupling to the light-distribution structure for distributing light emitted therefrom towards the plant via the light-distribution structure.

In some embodiments, the first portion of the LEDs are located at a central area of the illumination source, and the second portion of the LEDs are located at a peripheral area thereof.

In some embodiments, the plurality of LEDs comprises a first number of red-light LEDs for emitting red light, a second number of green-light LEDs for emitting green light, and a third number of blue-light LEDs for emitting blue light; and the second number is smaller than each of the first and third numbers.

In some embodiments, the lighting system further comprises: a light detector for monitoring a light reflected from the plant and/or a chlorophyll fluorescence emitted therefrom.

In some embodiments, the light-distribution structure comprises one or more reflectors.

In some embodiments, the one or more reflectors are positioned and oriented so as to distribute the at least one portion of the light to a plurality of parts of the plant at a plurality of angles.

In some embodiments, the one or more reflectors are configured for providing uniform illumination to the plant.

In some embodiments, the light-distribution structure comprises one or more fiber-optic cables In some embodiments, the one or more fiber-optic cables are coupled to at least a subset of the plurality of LEDs in a relationship of any one of: (i) a one-to-one relationship with one LED coupling to one fiber-optic cable; (ii) a many-to-one relationship with more than one LEDs coupling to one fiber-optic cable; (iii) a one-to-many relationship with one LED coupling to more than one fiber-optic cables; and (iv) a many-to-many relationship with more than one LEDs coupling to more than one fiber-optic cables.

In some embodiments, the one or more fiber-optic cables are coupled to all of the plurality of LEDs.

In some embodiments, the one or more fiber-optic cables comprise at least one diffusive fiber-optic cable, said diffusive fiber-optic cable comprising one or more diffusive areas for directing light travelling therein out of the diffusive fiber-optic cable.

In some embodiments, each of the one or more fiber-optic cables comprises a distal end located about a respective part of the plant and at a respective angle.

In some embodiments, the one or more fiber-optic cables are configured for distributing light with a predefined wavelength and a predefined intensity to target areas of the plant for treating unhealthy parts thereof and/or for insects and pests control.

In some embodiments, the lighting system further comprises: a lens system coupled to the one or more fiber-optic cables.

In some embodiments, the lighting system further comprises: a driver circuitry for adjusting one or more illumination parameters of the illumination source for optimizing physiological processes of growing the plant.

In some embodiments, the lighting system further comprises: one or more imaging devices. At least one of the one or more fiber-optic cables is configured for delivering light from the plant to the one or more imaging devices for capturing images of at least a portion of the plant for examining the growth or health of the plant.

According to one aspect of this disclosure, there is provided a method for facilitating the growth of a plant. The method comprises: emitting from an illumination source a light absorbable by the plant; and distributing at least a portion of the light towards the plant via a light-distribution structure.

In some embodiments, said distributing the at least portion of the light towards the plant via the light-distribution structure comprises: distributing the at least portion of the light towards the plant via at least one of one or more reflectors and one or more fiber-optic cables.

BRIEF DESCRIPTION OF THE DRAWINGS

The embodiments of the present disclosure will now be described with reference to the following figures, in which identical reference numerals in different figures indicate identical elements and in which:

FIG. 37A show the illumination-intensity distribution in a site using the LED light source and the reflectors shown in FIG. 33;

FIG. 37B show the illumination-intensity distribution in a site using a LED light source without reflectors;

FIG. 37C is a legend showing the scale of the illumination-intensity shown in FIGS. 37A and 37B;

FIG. 38 is a schematic diagram of a LED grow-light system having a LED light source and a plurality of fiber-optic cables, according to some embodiments of this disclosure;

DETAILED DESCRIPTION

Figure 1:
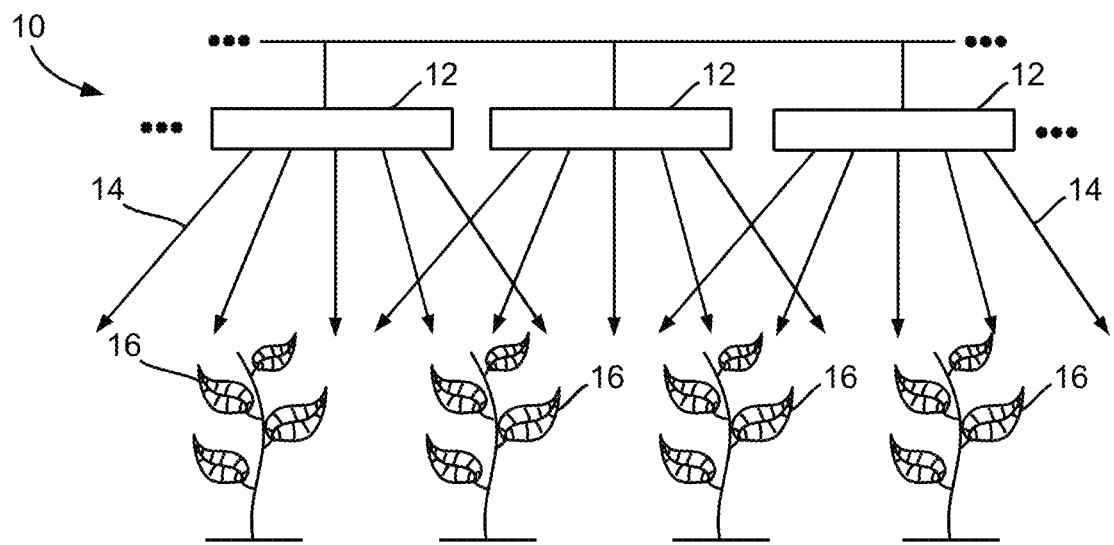
FIG. 1 is a schematic diagram of a prior-art Light-Emitting-Diode (LED) grow-light system.
Figure 2:
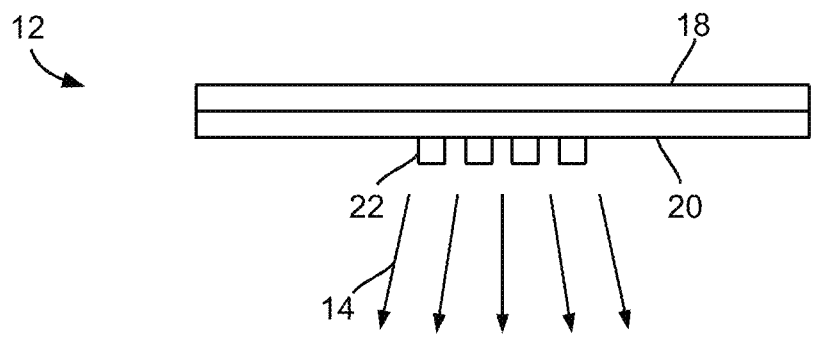
FIG. 2 is a block diagram showing the structure of a prior-art LED light apparatus of the LED grow-light system shown in FIG. 1.
Figure 3:
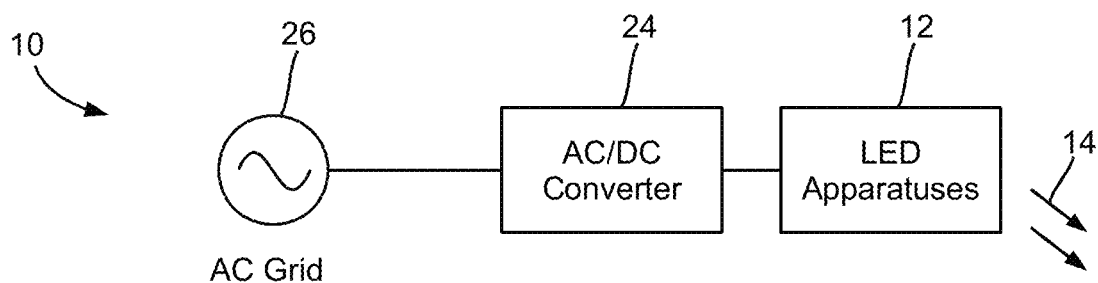
FIG. 3 is a block diagram showing the electrical components of the prior-art LED grow-light system shown in FIG. 1.
Figure 4:
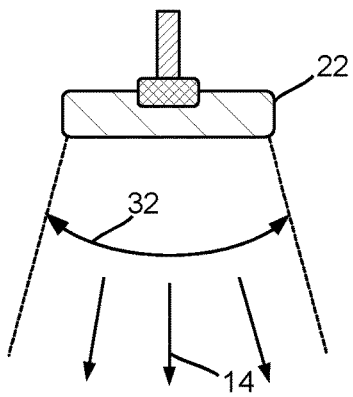
FIG. 4 is a schematic diagram of a LED of the prior-art LED light apparatus shown in FIG. 2.
Figure 5:
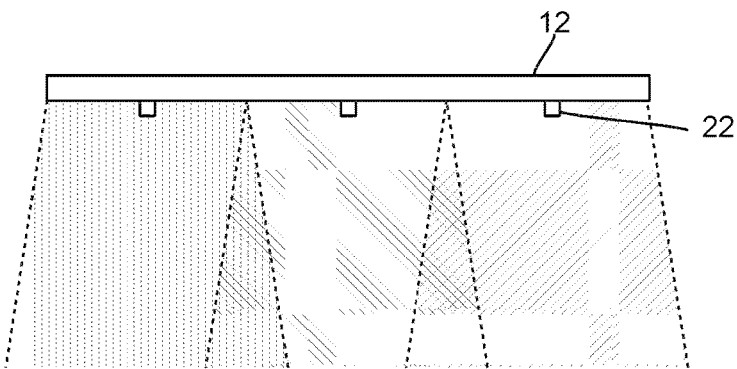
FIG. 5 is a schematic diagram of the light distribution of the prior-art LED light apparatus shown in FIG. 2.
Figure 6:
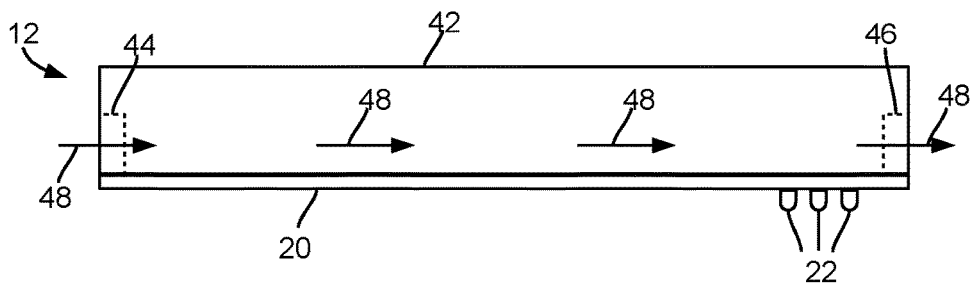
FIG. 6 is a block diagram showing the structure of the prior-art LED light apparatus shown in FIG. 2 with forced-convection cooling.

The present disclosure generally relates to a Light-Emitting Diode (LED) light apparatus having one or more LEDs. In some embodiments, the LED light apparatus may be a high-power LED light apparatus for using in a LED grow-light system similar to that shown in FIG. 1 as a light source for facilitating the growth of one or more plants in a controlled environment. In some embodiments, the LED light apparatus may be used as a light source of environmental illumination for illuminating a street, a highway, a yard, and/or the like.

Herein, the LEDs may be any suitable LEDs such as the conventional high-power LEDs, quantum-dot LEDs (QLEDs), and/or the like.

In some embodiments, the LED light apparatus disclosed herein uses passive cooling with natural convection for cooling the printed circuit board (PCB) and the LEDs thereon. Testing results show that the LED light apparatus disclosed herein maintains a similar thermal performance as that of forced-convection cooling without using any fans.

In some embodiments, the LED light apparatus may be a high-power LED light apparatus comprising a plurality of LED panels rotatably mounted on a frame with gaps therebetween. Each LED panel comprises a plurality of LEDs for emitting light and a motor for rotating the LED panel to adjust the light direction thereof. A controller controls the motors to adjust the light directions of the corresponding LED panels for achieving a uniform light distribution across the LED light apparatus, adjusting the light focus and/or light span of the LED light apparatus, and/or adjusting the illumination area thereof.

In some embodiments, the LED light apparatus comprises a heat sink attached to a rear side of the PCB of each LED panel. The heat sink comprises a plurality of fins for dissipating heat generated by the PCB and components thereon. The gaps between adjacent LED panels and between the frame and LED panels adjacent thereto facilitate heat convection and significantly improves the cooling performance of the LED light apparatus.

According to some embodiments of this disclosure, a light system comprises a light source such as a LED light source for facilitating the growth of one or more plants and a light-distribution structure for distributing light emitted from the LED light source to various parts of the plants.

In some embodiments, the light-distribution structure comprises reflectors for achieving efficient illumination of plants.

In some embodiments, the light-distribution structure comprises fiber-optic cables for achieving efficient illumination of plants.

In some embodiments, the light-distribution structure comprises diffusive fiber-optic cables or cords for achieving efficient illumination of plants.

In the following, embodiments of an electrical device are described. In the description, directional phrases such as "top", "bottom", "up", "down", "front", "rear", "left" and "right" are used only for describing the directions of components relative to each other.

Figure 7:
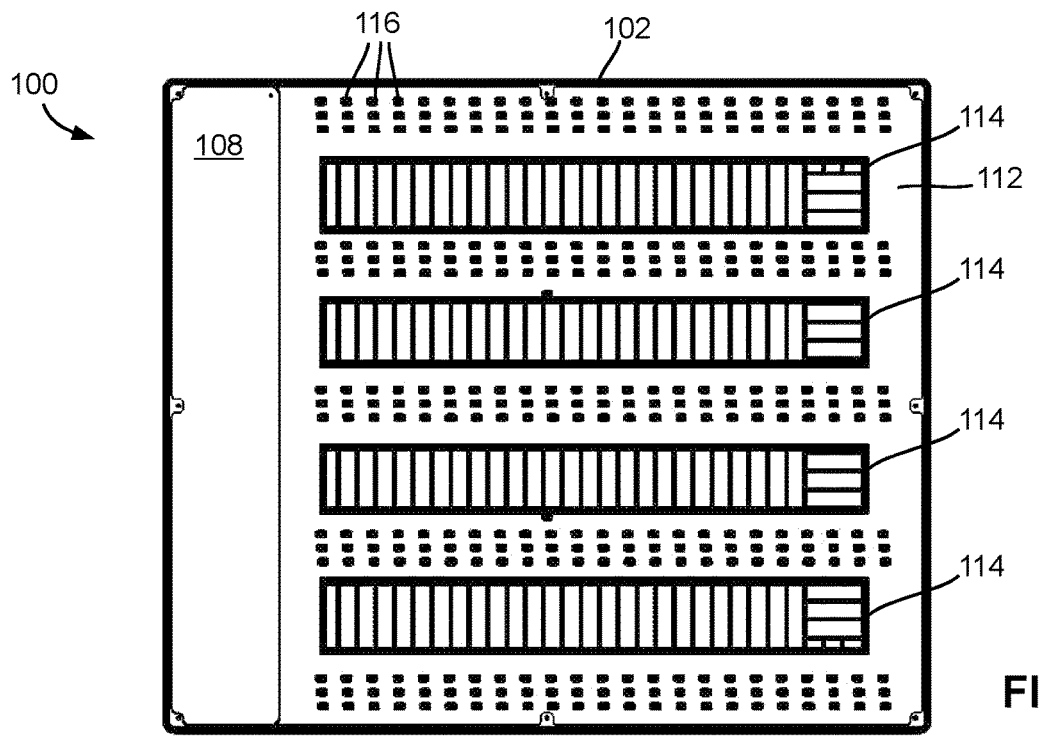
FIG. 7 is a front view of a LED light apparatus comprising a printed circuit board (PCB) and a plurality of LEDs thereon, according to some embodiments of this disclosure.
Figure 8A:
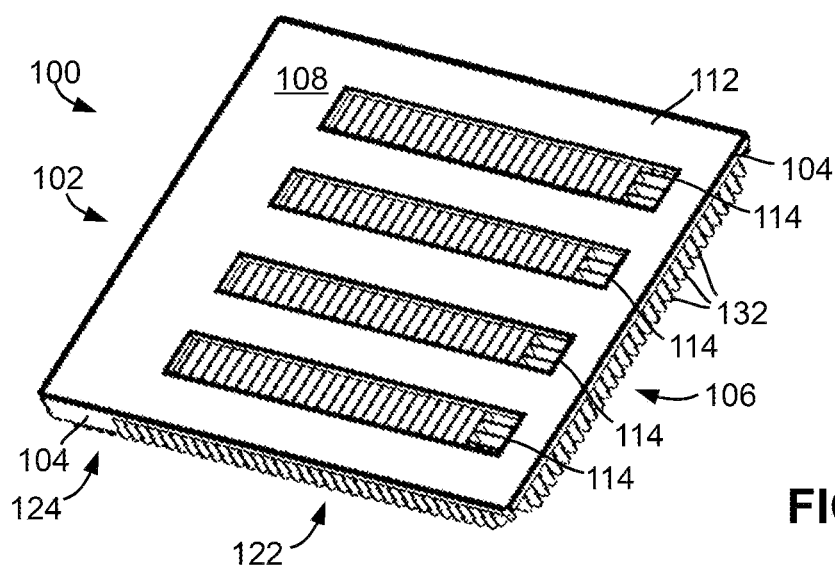
FIG. 8A is a front perspective view of the LED light apparatus shown in FIG. 7, wherein the LEDs are not shown for ease of illustration.
Figure 8B:
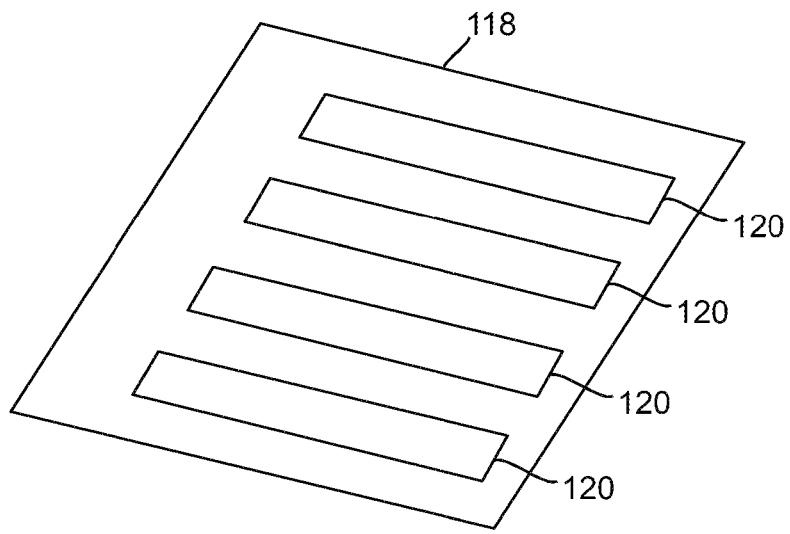
FIG. 8B is a partially exploded view of the LED light apparatus shown in FIG. 7, showing the cover and the housing thereof.
Figure 8B:
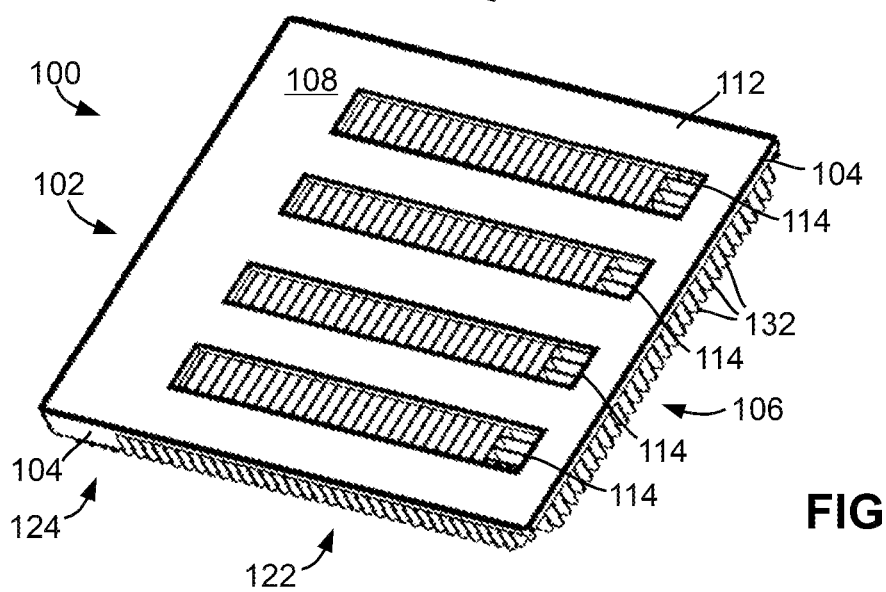

Turning now to FIGS. 7 and 8, a LED light apparatus is shown and is generally identified using reference numeral 100. The LED light apparatus 100 comprises a housing 102 having four sidewalls 104 and a rear-wall structure 106 with an open front 108, thereby forming one or more receptacles for receiving and engaging therein one or more printed circuit boards (PCBs) such as the PCB 112, and necessary components of the LED light apparatus 100 (described later).

The PCB 112 comprises one or more elongated openings 114 (such as elongated rectangular openings or openings with other suitable elongated shapes) and a plurality of LEDs 116 on a front side thereof about or in proximity with the openings 114 and preferably arranged in one or more matrix forms.

Figure 9:
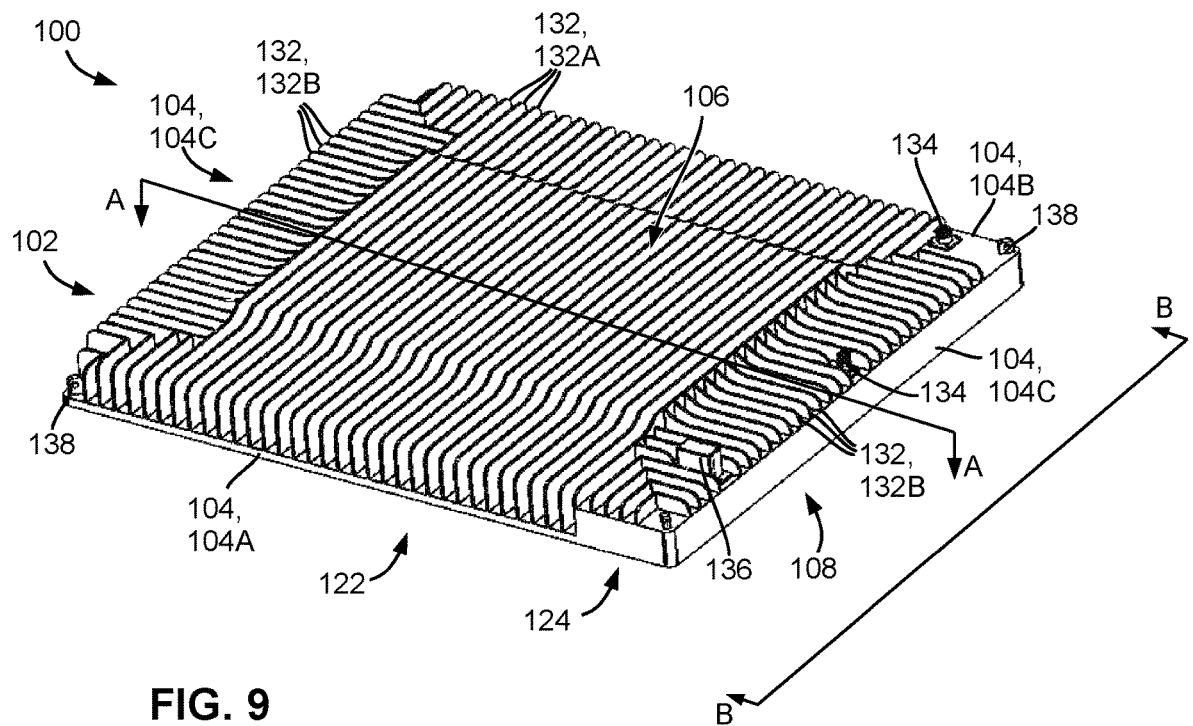
FIG. 9 is a rear perspective view of the LED light apparatus shown in FIG. 7 showing a heat sink thereof.

The sidewalls 104 of the housing 102 are made of a rigid material such as hard plastic. As shown in FIGS. 8 and 9, the sidewalls 104 form a first portion 122 with a small depth suitable for receiving the PCB 112 and coupling the PCB 112 to the rear-wall structure 106, and a second portion 124 with a large depth (e.g., larger or deeper than the first depth) forming a chamber suitable for accommodating necessary components such as electrical components of a power supply.

The rear-wall structure 106 is formed by a heat sink (also denoted using reference numeral 106) made of a suitable thermal-conductive material, preferably a suitable material with high thermal conductivity such as steel, aluminum, and/or other suitable metal, and comprising a base 130 and a plurality of fins 132 equidistantly spaced apart from each other and extending outwardly therefrom.

In these embodiments, the rear-wall structure or heat sink 106 comprises a first set of fins 132A extending between opposite sidewalls 104A and 104B, and a second set of fins 132B extending laterally outwardly from the outermost ones of the first set of fins 132A to sidewalls 104C adjacent thereto. In these embodiments, the sidewalls 104C are substantively perpendicular to the sidewalls 104A and 104B, and the second set of fins 132B are also substantively perpendicular to the first set of fins 132A.

Such an arrangement of fins 132 facilitate the arrangement of other components about the edges (also referred to using reference numeral 104) of the rear-wall structure 106, such as power supply connectors 134, other electrical terminals 136, mechanical connectors 138, and the like, without interrupting one or more fins 132. Rather, the fins 132 only need to be shortened to bypass the locations of other components on the rear-wall structure 106.

Figure 10A:
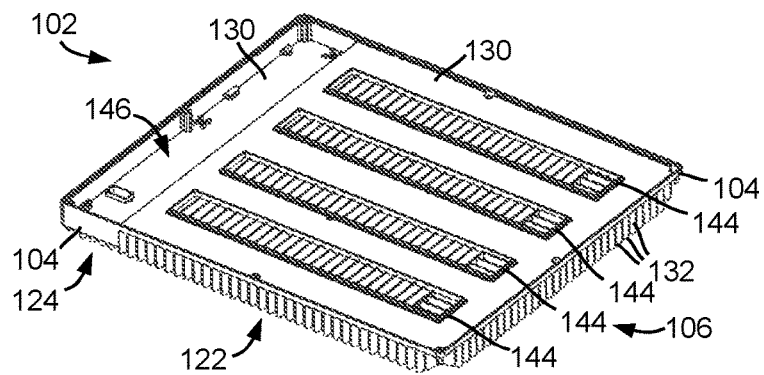
FIG. 10A is a perspective view of a housing of the LED light apparatus shown in FIG. 7.

As shown in FIG. 10A, the base 130 of the heat sink 106 comprises one or more elongated openings 144 at locations corresponding to the openings 114 of the PCB 112 and with a shape corresponding thereto, For example, the shape of the openings 144 may be an elongated rectangular shape or other elongated shape corresponding to that of the openings 114. The locations of the openings 144 are such that at least some of the openings 144 are vertically aligned with the openings 114. Herein, the term "vertical" or "vertically" refers to the direction from the front side of the LED light apparatus 100 to the rear side thereof or from the rear side to the front side thereof.

In these embodiments, the openings 144 are located in the first portion 122 of the heat sink 106. Moreover, the base 130 of the heat sink 106 and the sidewalls 104 form a chamber 146 in the second portion 124 for receiving therein necessary components such as electrical components of a power supply.

Figure 11:
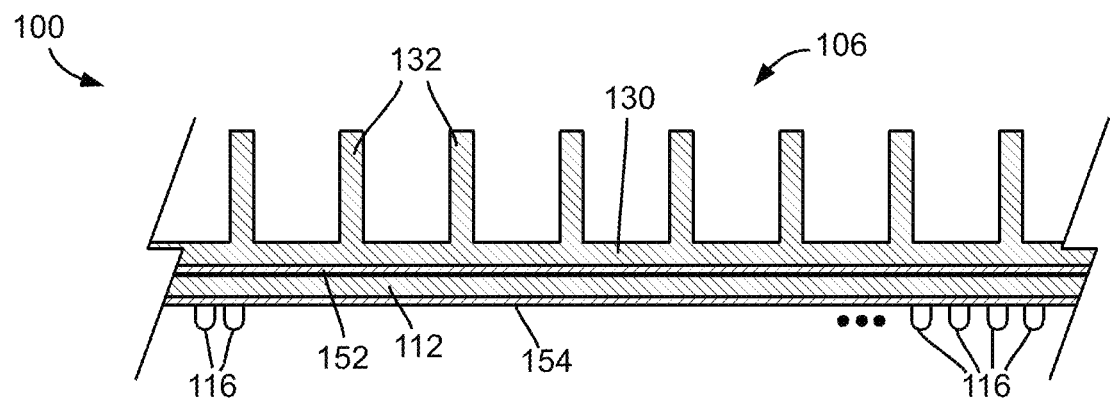
FIG. 11 is a portion of a cross-sectional view of the LED light apparatus shown in FIG. 7 along the cross-section line A-A shown in FIG. 9 about the area of a first set of fins.

FIG. 11 is a portion of a cross-sectional view of the LED light apparatus 100 along the cross-section line A-A shown in FIG. 9 about the area of the first set of fins 132A. FIG. 11 only shows a portion of the LEDs 116 for ease of illustration.

As shown, the base 130 of the heat sink 106 is in close proximity with the PCB 112 that the LEDs 116 mounted thereon. In particular, the base 130 is in thermal contact with the PCB 112 via a layer of thermal-conductive potting material 152 such that the base 130 and the PCB 112 may exchange energy through the process of heat via the layer of thermal-conductive potting material 152.

Preferably, the layer of thermal-conductive potting material 152 is a potting material with high thermal conductivity such as resin, for improved thermal contact between the PCB 112 and the heat sink 106. The layer of potting material 152 affixes the back of the PCB 112 to the base 130 of the heat sink 106 and conducts the heat generated by the PCB 112 and components thereon (not shown) to the base 130 of the heat sink 106 which dissipates the heat through the fins 132. The layer of potting material 152 also acts as a barrier to moisture and water ingression into the PCB 112 as well as an electrical insulation for the PCB 112.

In these embodiments, the PCB 112 also comprises a conformal coating layer 154 on an exterior side thereof (or a front side thereof) for protecting the PCB 112 against moisture, dust, chemicals, temperature extremes, and the like that may otherwise damage the electronics of the PCB 112.

Figure 12:
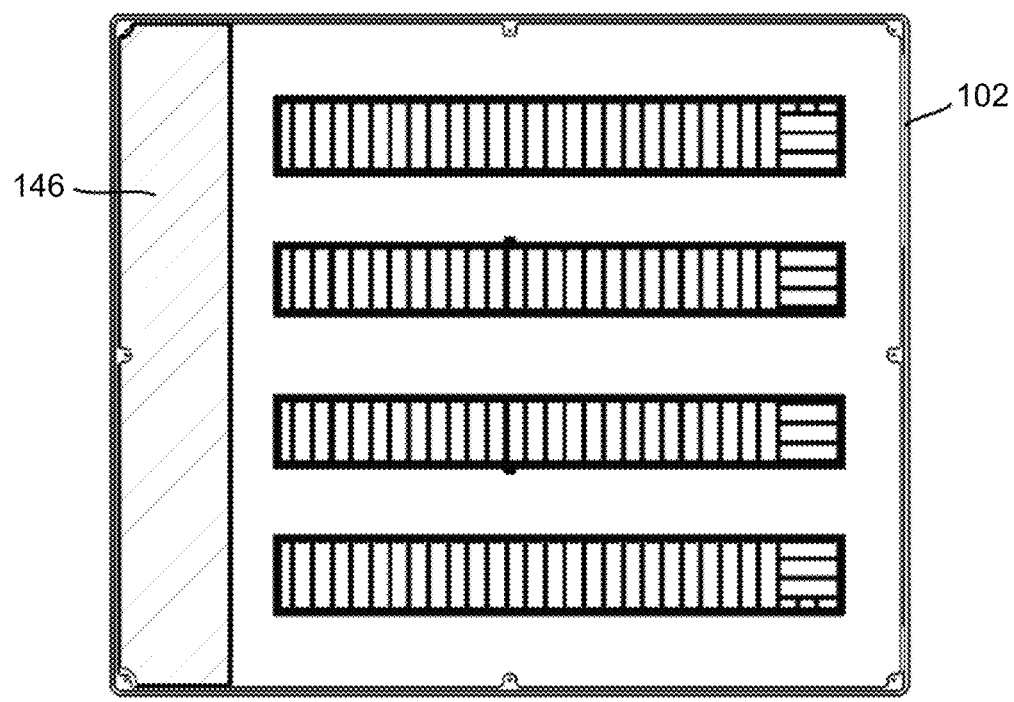
FIGS. 12, 13A, and 13B show a first and a second step of assembling the LED light apparatus shown in FIG. 7.
Figure 13A:
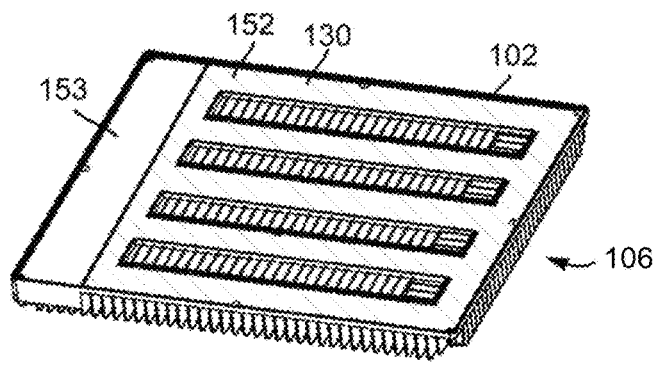
Figure 13B:
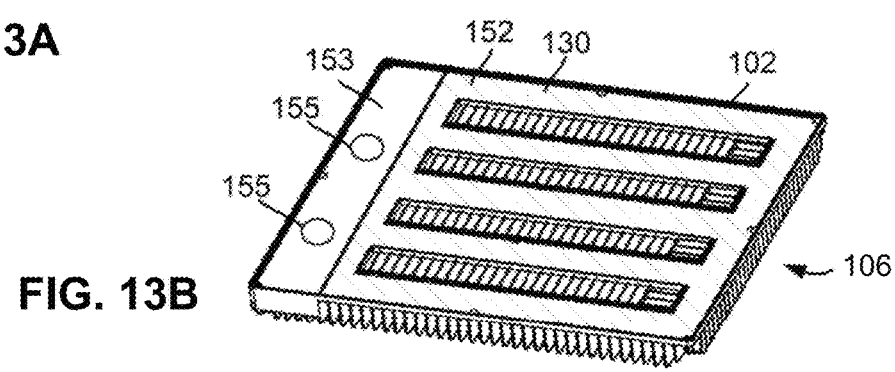

As shown in FIG. 12, to assemble the LED light apparatus 100, one may first install power supply and other necessary components (not shown) in the chamber 146 of the housing 102. As shown in FIG. 13A, a layer of heat-conductive potting compound 152 is coated onto the base 130 of the heat sink 106 and cured. Then, after wiring with the components in the chamber 146, the PCB 112 is installed to the front opening 108 of the housing 102 and coupled to the layer of the heat-conductive potting compound 152 to form the LED light apparatus 100, as shown in FIGS. 7 and 8.

The openings 114 of the PCB 112 and the openings 144 of the heat sink 106 significantly enhance flow of cooling air about the PCB 112 and through the fins 132, thereby significantly facilitating heat convection and improving the cooling performance of the LED light apparatus 100.

Figure 14:
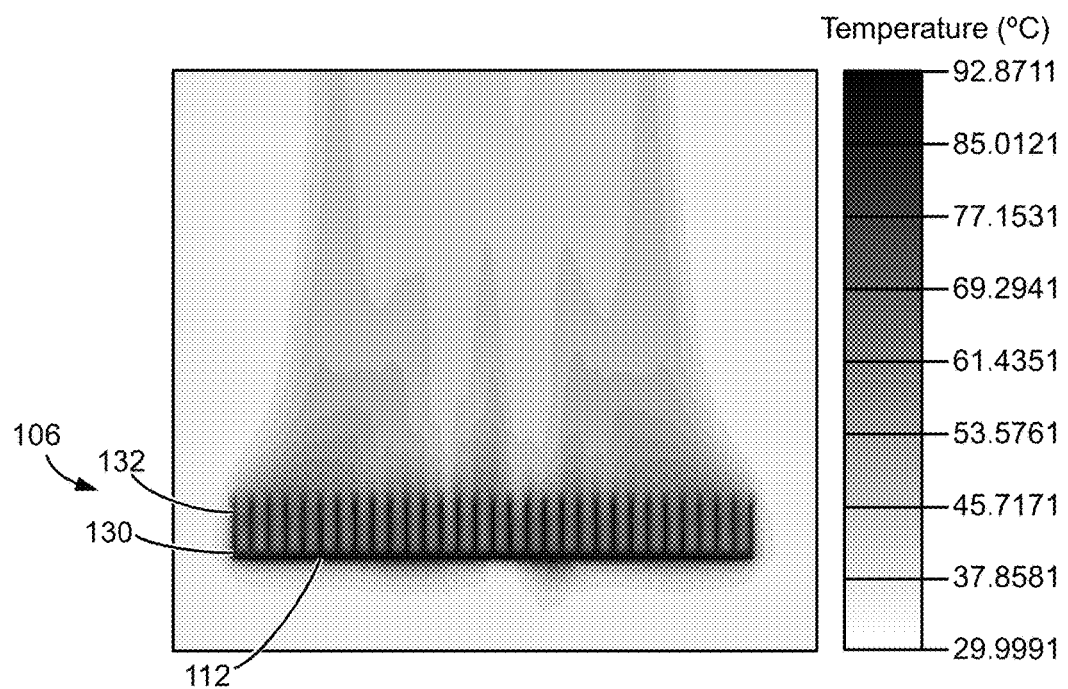
FIG. 14 is a cross-sectional view of the LED light apparatus shown in FIG. 7 along the cross-section line A-A shown in FIG. 9 for showing the temperature profile about the PCB of the LED light apparatus where the PCB and the heat sink do not comprise any openings.
Figure 15:
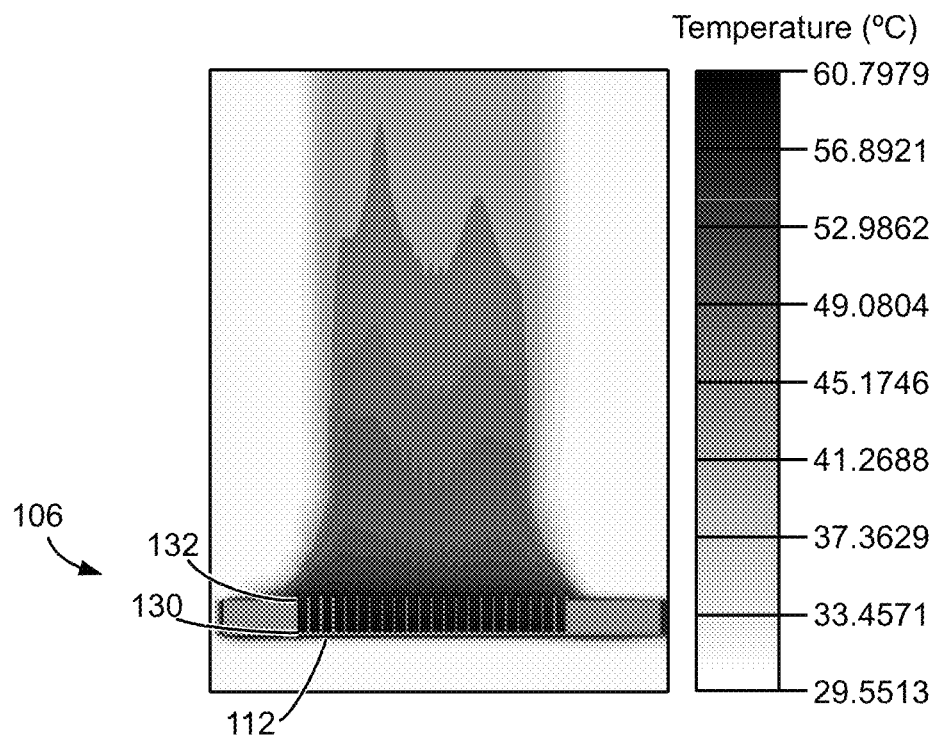
FIG. 15 is a cross-sectional view of the LED light apparatus shown in FIG. 7 along the cross-section line A-A shown in FIG. 9 for showing the temperature profile about the PCB of the high-power LED light apparatus where the PCB and the heat sink comprise openings at corresponding locations.
Figure 16:
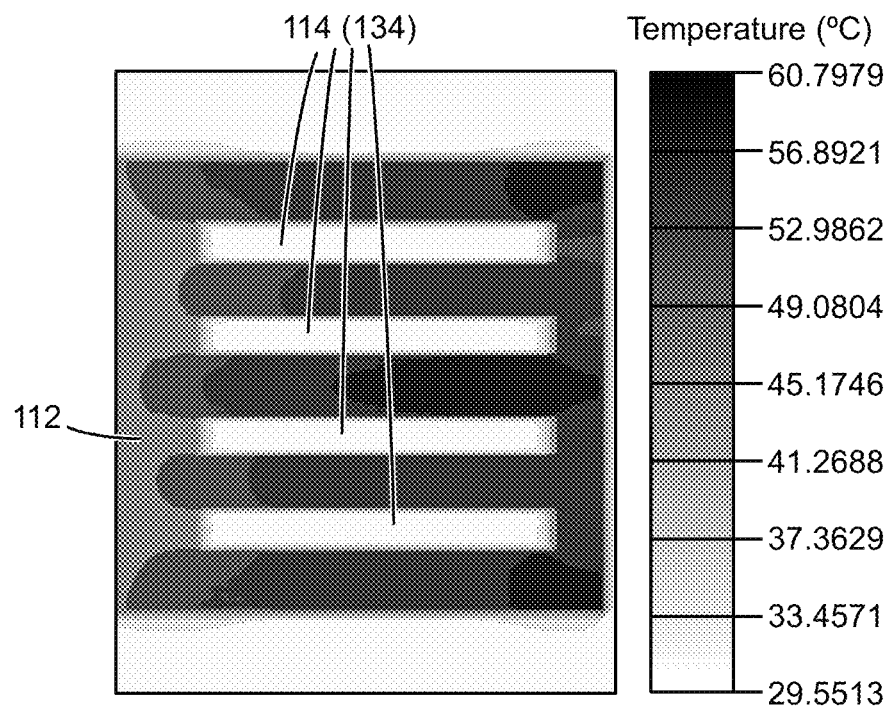
FIG. 16 is a cross-sectional view of the LED light apparatus shown in FIG. 7 along the cross-section line B-B shown in FIG. 9 for showing the temperature profile at the PCB of the LED light apparatus where the PCB and the heat sink comprise openings at corresponding locations.

FIGS. 14 to 16 show the testing results of the thermal performances of the heat sink 106 in terms of temperature profiles about the PCB 112 for the same heat dissipation with and without the openings 114 and 144.

FIG. 14 is a cross-sectional view of the LED light apparatus 100 along the cross-section line A-A shown in FIG. 9 for showing the temperature profile about the PCB 112 where the PCB 112 and the heat sink 106 do not comprise any openings 114 and 144. As shown, the maximum temperature may reach about 93° C. at the fins 132 and the base 130.

FIG. 15 is a cross-sectional view of the LED light apparatus 100 along the cross-section line A-A shown in FIG. 9 for showing the temperature profile about the PCB 112 where the PCB 112 and the heat sink 106 comprise the openings 114 and 144, respectively, as described above. As can be seen, while the temperature may reach about 61° C. at locations in proximity with the fins 132, the maximum temperature at the fins 132 and the base portion 130 is only about 45° C., thereby clearly indicating that the openings 114 and 144 significantly improve the thermal performance of the heat sink 106.

FIG. 16 is a cross-sectional view of the LED light apparatus 100 along the cross-section line B-B shown in FIG. 9 for showing the temperature profile at the PCB 112 where the PCB 112 and the heat sink 106 comprise the openings 114 and 144, respectively, as described above. As shown, the maximum temperature on the PCB 112 is about 60° C.

Figure 10B:
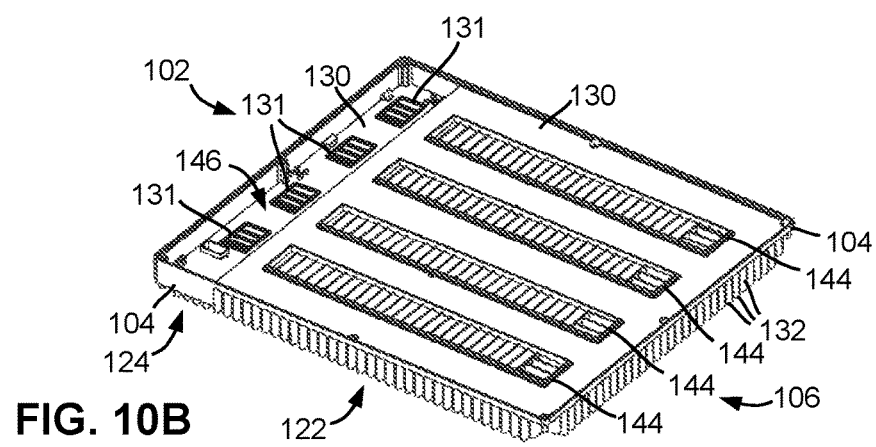
FIG. 10B is a perspective view of a housing of the LED light apparatus shown in FIG. 7 showing the openings in the second portion of the housing.

In above embodiments, the heat sink 106 at the second portion 124 does not comprise any openings. In some alternative embodiments, the heat sink 106 may also comprise one or more openings 131 at the second portion 124 (corresponding to the chamber 146, see FIG. 10B). Moreover, the PCB mounted in the chamber 146 may also comprise one or more openings.

Figure 17:
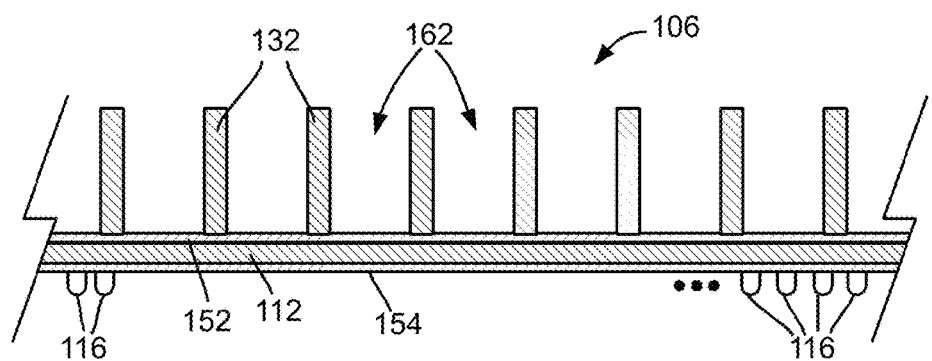
FIG. 17 is a cross-sectional view of the LED light apparatus, according to some alternative embodiments of this disclosure.
Figure 18:
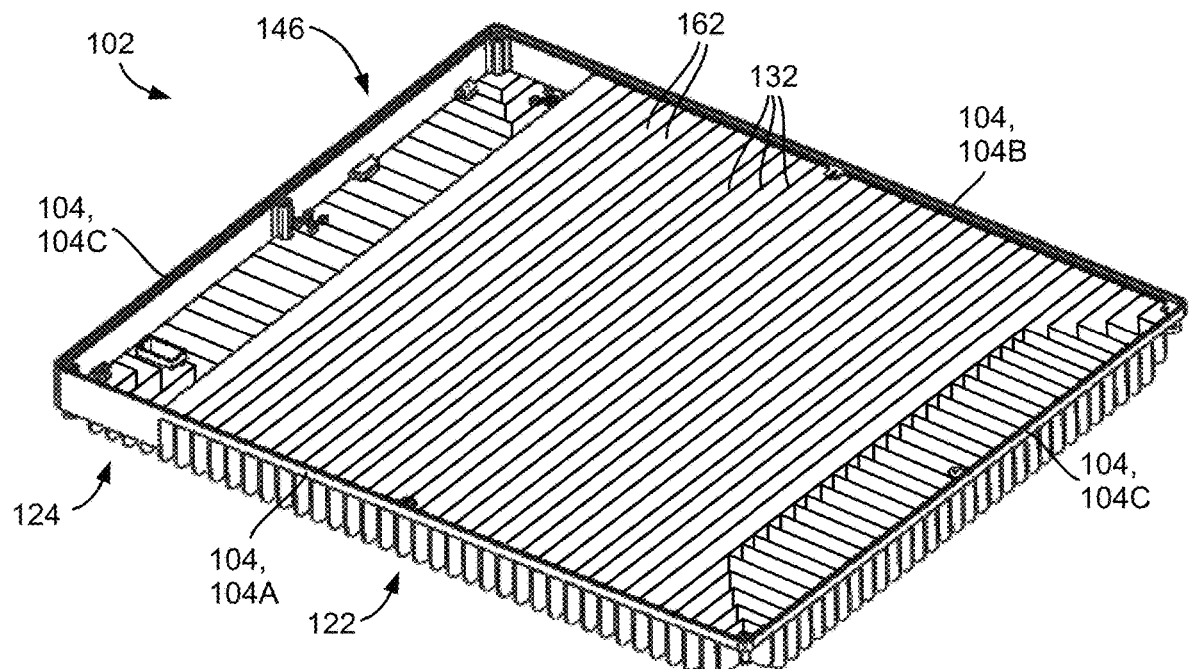
FIG. 18 is a perspective view of a housing of the LED light apparatus shown in FIG. 17.

In some alternative embodiments as shown in FIGS. 17 and 18, the heat sink 106 does not comprise a base 130. In these embodiments, the fins 132 extend between and mounted on opposite sidewalls 104A and 104B or extend between and mounted on the outmost fins 132 and the adjacent sidewalls 104C. As the fins 132 are spaced from each other, the spaces or gaps 162 therebetween act as the openings similar to the openings 144 in above-described embodiments. The PCB 112 in these embodiments may also comprise one or more openings 114. However, the positions of the openings 114 of the PCB 112 do not have to match those of the gaps 162.

Figure 19:
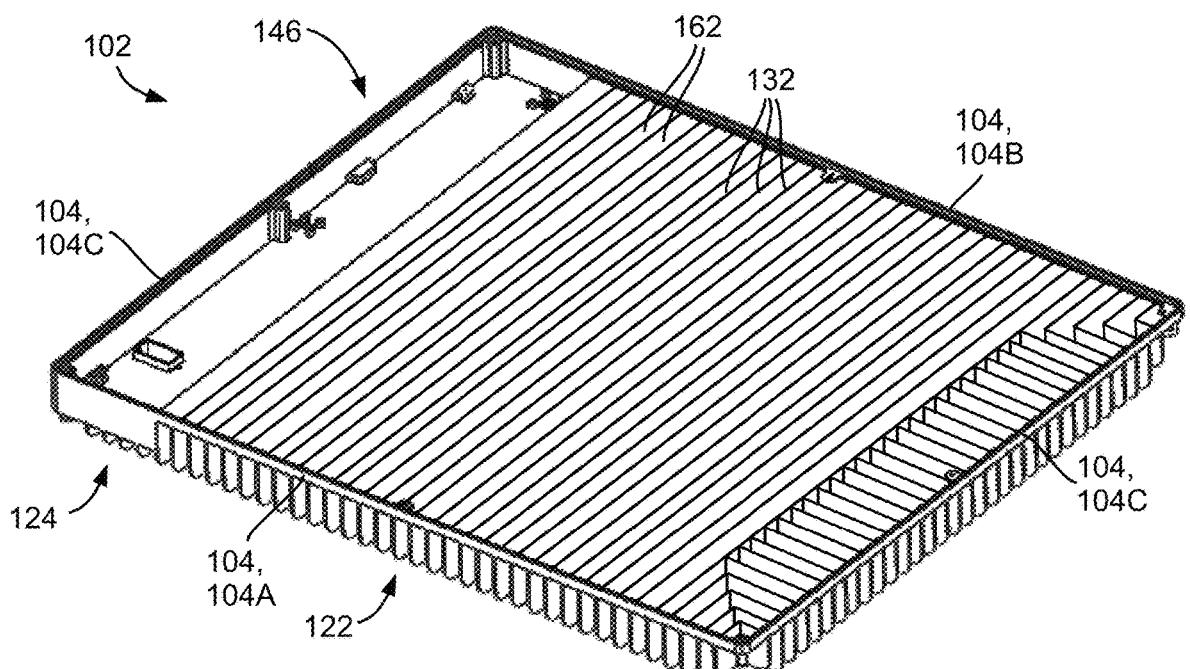
FIG. 19 is a perspective view of a housing of a LED light apparatus, according to some alternative embodiments of this disclosure.

In some alternative embodiments as shown in FIG. 19, a portion of the heat sink 106 such as the second portion 124 corresponding to the chamber 146 may comprise a base 130 while other portion thereof does not comprise any base.

In above embodiments, the LED light apparatus 100 comprises a first PCB 112 for the LEDs 116 mounted to the first portion 122 of the heat sink 106 and a second PCB for the power supply mounted about the second portion 124 of the heat sink 106. In some alternative embodiments, the LED light apparatus 100 may comprise a single PCB 112 for both the LEDs 116 and the power supply.

Although in above embodiments, the housing 102 of the LED light apparatus 100 has a rectangular shape with four side walls 104, in some alternative embodiments, the housing 102 of the LED light apparatus 100 may have any other suitable shape formed by a plurality of sidewalls 104 such as a circular shape, a triangular shape, a pentagonal shape, a hexagonal shape, or the like.

In some embodiments, the housing 102 may have openings on one or more sidewalls 104 for heat management. In some related embodiments, the housing 102 may have openings on one or more sidewalls 104 for heat management but may not have any openings on the rear-wall structure 106.

In above embodiments, the housing 102 does not comprise a front wall, or in other words, the housing 102 comprise an opening at the front side thereof. The PCB 112 or the PCB 112 with the conformal coating layer 154 is thus exposed to the ambient environment. In some embodiments as shown in FIG. 8B, the housing 102 comprises a front wall 118 and the PCB 112 is enclosed between the front wall 118 and the rear-wall structure. In these embodiments, the front wall 118 may comprise one or more elongated openings 120 at locations corresponding to those of the PCB 112 for facilitating heat convection and heat dissipation. In some related embodiments, the front wall may comprise a lens structure having one or more lenses for directing the light emitted from the LEDs 116.

Although in above embodiments, the openings 114 of the PCB 112 are elongated openings, it some embodiments, the openings 114 of the PCB 112 may be in other suitable shapes such as circle, triangle, other polygonal shape, and even irregular shapes.

In some embodiments, the rear-wall structure 106 of the housing 102 may not comprise any fins.

In above embodiments, the high-power LEDs 116 are the main heat source and are distributed about or in proximity with the elongated openings 114. In some embodiments, the LED light apparatus 100 may comprise other high-power components generating significant heat in operation. Such components may also be distributed about the elongated openings 114 for efficient heat convection and heat dissipation purposes.

The openings 114 of the PCB 112 provide ventilation and allow heat convection through the PCB 112 compared to prior-art design that only allows heat convection around the PCB. The openings of the housing 102 (e.g., the openings 144 of the rear-wall structure 106, and/or openings on other locations of the housing 102) collaborate with the openings 114 of the PCB 112 and further facilitate the ventilation/heat convection, as indicated by the testing results shown in FIGS. 14 to 16.

Figure 20:
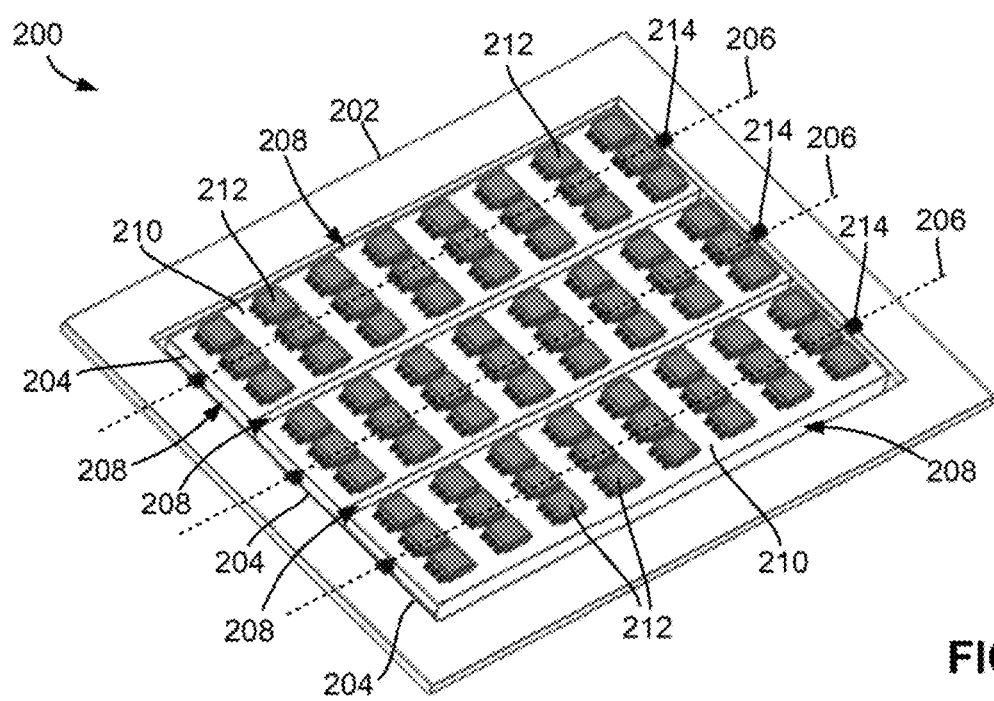
FIG. 20 is a front-perspective view of a high-power LED light apparatus, according to some embodiments of this disclosure, wherein the LED light apparatus comprises a plurality of rotatable LED light panels.
Figure 21:
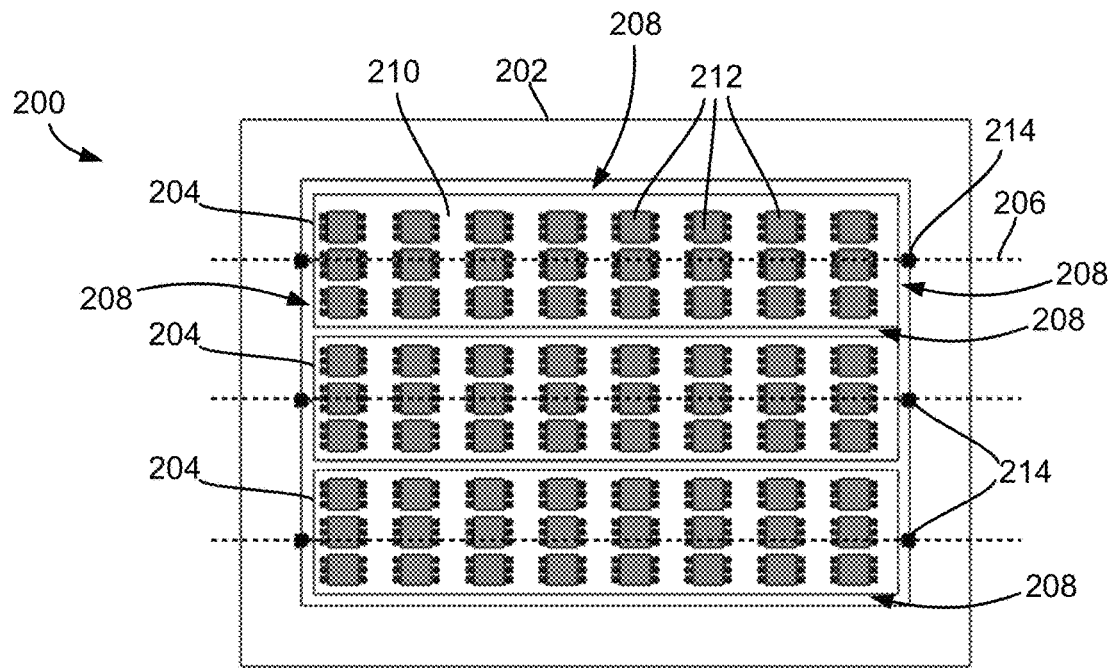
FIG. 21 is a plan view of the high-power LED light apparatus shown in FIG. 20.

FIGS. 20 and 21 show a high-power LED light apparatus 200 according to some embodiments of this disclosure. The LED light apparatus 200 in these embodiments comprises a frame 202 made of a rigid material, and a plurality of LED panels 204 rotatably mounted to the frame 202. The LED panels 204 are rotatable about respective axes 206 in parallel with each other. Each LED panel 204 is spaced from the LED panels 204 and/or the frame 202 adjacent thereto with a gap 208 therebetween. The gaps 208 allow the LED panels 204 to rotate and facilitate heat convection and heat dissipation.

Each LED panel 204 comprises a PCB 210 on a front side thereof and one or more LEDs 212 on the PCB 210 for light emission. Each LED panel 204 also comprises a motor 214 for rotating the LED panel 204 about the axis 206 within a predefined angular range. A control circuitry (not shown) is electrically coupled to the LEDs 212 and the motor 214 for controlling the lighting of the LEDs 212 and for rotating the LED panel 204 to adjust the angle of the light direction thereof.

Figure 22:
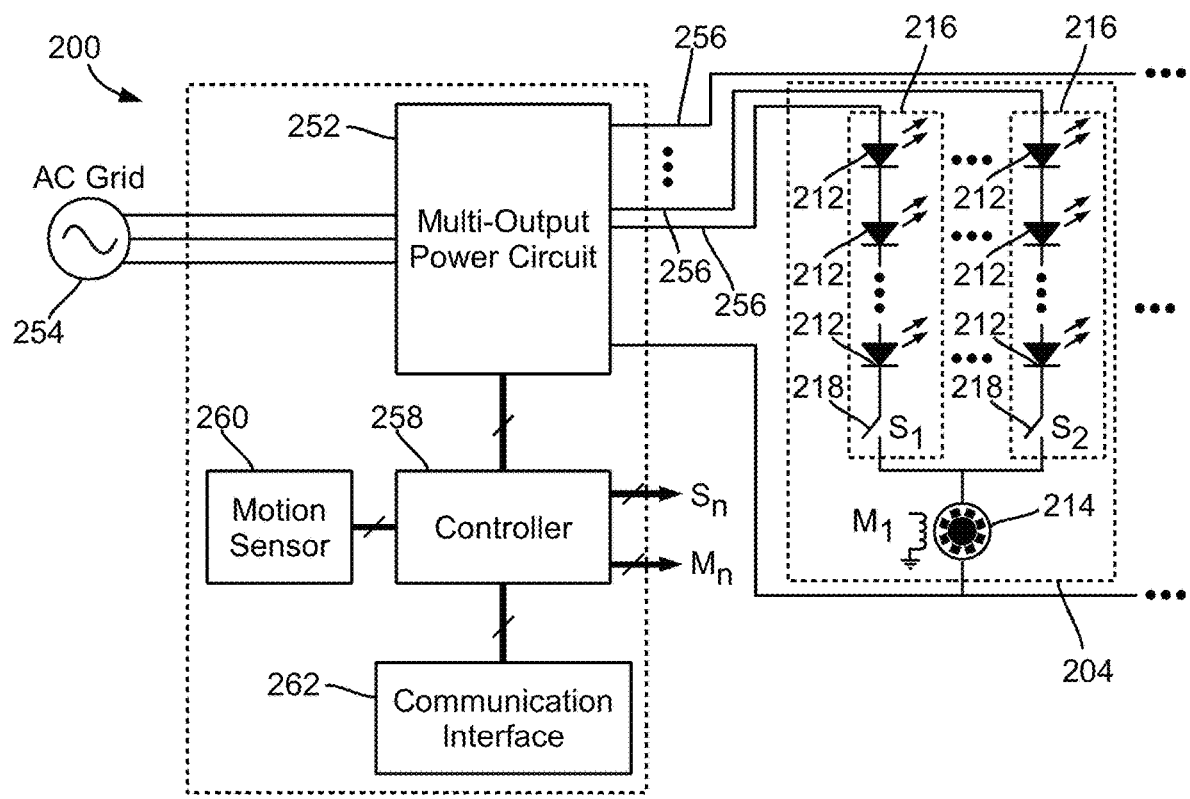
FIG. 22 is a block diagram showing the electrical structure of the high-power LED light apparatus shown in FIG. 20.

FIG. 22 shows the electrical structure of the LED light apparatus 200. In these embodiments, the LEDs 212 on each LED panel 204 are arranged into one or more LED groups 216. Each LED group 216 comprises one or more LEDs 212 and a switch 218 (also denoted as $S_1, S_2, \ldots$) connected in series. The LED groups 216 of each LED panel 204 is connected to the motor 214 thereof.

The LED light apparatus 200 comprises a multi-output power circuit 252 for converting the alternate-current (AC) power of an AC power source 254 such as an AC grid to a direct current (DC) power for driving the LEDs 212. The multi-output power circuit 252 comprises a plurality of DC outputs 256 with each DC output 256 connected to a LED group 216 for individually powering the LEDs 212 thereof.

The LED light apparatus 200 also comprises a control circuitry 258 configured for controlling the multi-output power circuit 252, the switches 218 (via the signals $S_n$ output thereto), and the motors 214 (via the signals $M_n$ output thereto) for controlling the operation of LED light apparatus 200.

In these embodiments, the control circuitry 258 receives sensor data and instructions from a motion sensor 260 and a communication interface 262, and uses received data and instructions to adjust the operation of the LED panels 204. Although not shown, the LED light apparatus 200 may also comprise other components such as a light sensor for collecting suitable sensor data that the control circuitry 258 may use.

For example, when the control circuitry 258 receives a Turn-On instruction via the communication interface 262, the control circuitry 258 may close the switches 218 and turn on the multi-output power circuit 202 to drive the LEDs 212 for illumination.

In another example, the control circuitry 258 may close the switches 218 and turn on the multi-output power circuit 202 to drive the LEDs 212 for illumination when the motion sensor 260 detects one or more moving objects such as vehicle traffics, pedestrians, and the like.

In yet another example, the control circuitry 258 may use the sensor data collected by a light sensor (not shown) for determining the intensity of ambient illumination. If the ambient illumination is sufficient such as greater than a predetermined illumination threshold, the control circuitry 258 may open one or more switches 218 to disable the corresponding one or more LED strings 242 for reducing the light intensity of the LED light apparatus 200. On the other hand, if the ambient illumination is insufficient such as lower than a predetermined illumination threshold, the control circuitry 258 may close one or more switches 218 to enable the corresponding one or more LED strings 242 for increasing the light intensity of the LED light apparatus 200.

Figure 23:
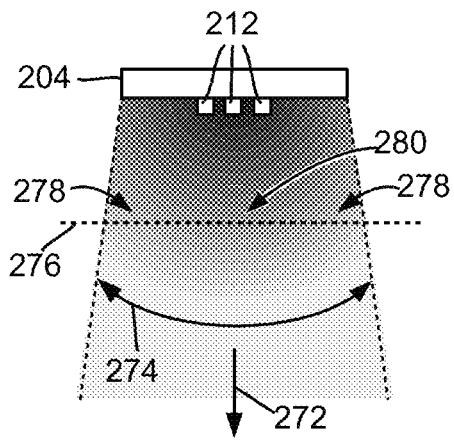
FIG. 23 is a schematic diagram showing a LED panel of the high-power LED light apparatus shown in FIG. 20 and the light distribution thereof.

As shown in FIG. 23, each LED panel 204 has a light direction 272 generally perpendicular thereto and a light angular-span 274 being the summation of the light angular-spans of the LEDs 212 thereof. As the LEDs 212 may have different light angular-spans, the light distribution with respect to a reference plane 276 perpendicular to the light direction 272 (for example, parallel to the LED panel 204) may be non-uniform. For example, the light of the LED panel 204 may have the highest intensity about the center 280 of the light angular-span 274 and may have a reduced intensity about the edge 278 of the light angular-span 274.

Figure 24:
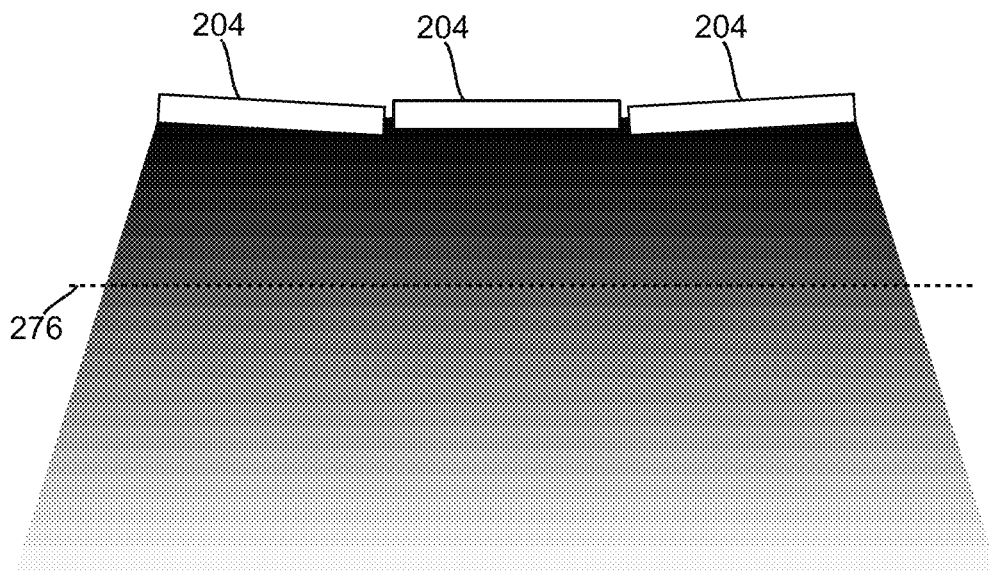
FIG. 24 is a schematic diagram showing the high-power LED light apparatus shown in FIG. 20 and the light distribution thereof in some embodiments, wherein the LED panels thereof are adjusted for a uniform light distribution.

In some embodiments, the light distribution of each LED panel 204 may be determined via a calibration process, and the control circuitry 258 controls the motors 214 of the LED panels 204 to individually rotate each LED panel 204 to achieve a uniform or near-uniform light distribution with respect to a reference plane 276, as shown in FIG. 24.

In some embodiments, the LED light apparatus 200 may comprise one or more light sensors (not shown) for measuring the light distribution of the LED light apparatus 200. The control circuitry 258 uses the obtained light distribution measurement to control the motors 214 of the LED panels 204 to individually rotate each LED panel 204 to achieve a uniform or near-uniform light distribution with respect to a reference plane 276.

Figure 25:
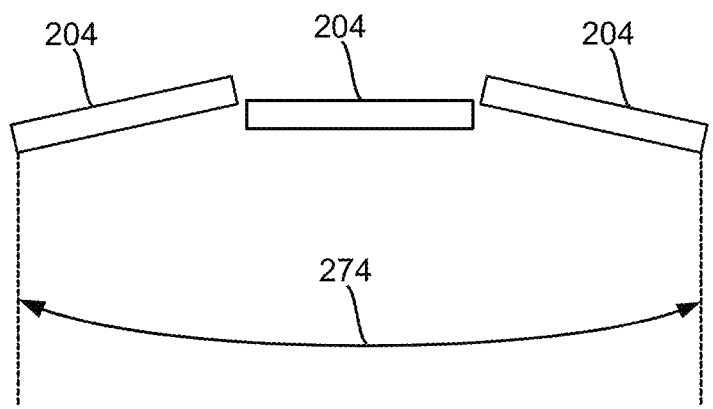
FIG. 25 is a schematic diagram showing the high-power LED light apparatus shown in FIG. 20 and the light distribution thereof in some embodiments, wherein the LED panels thereof are adjusted for adjusting the light span of the high-power LED light apparatus.

In some embodiments, the control circuitry 258 may control the motors 214 of the LED panels 204 to individually rotate each LED panel 204 to adjust the illumination area or the light angular-span 274 of the LED light apparatus 200, as shown in FIG. 25.

Figure 26:
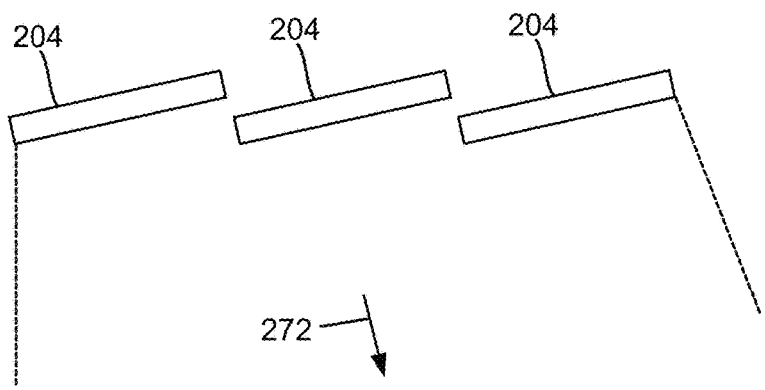
FIG. 26 is a schematic diagram showing the high-power LED light apparatus shown in FIG. 20 and the light distribution thereof in some embodiments, wherein the LED panels thereof are adjusted for adjusting the angle of the light direction of the high-power LED light apparatus.

In some embodiments, the control circuitry 258 may control the motors 214 of the LED panels 204 to individually rotate each LED panel 204 to adjust the light direction 272 of the LED light apparatus 200, as shown in FIG. 26.

Figure 27:
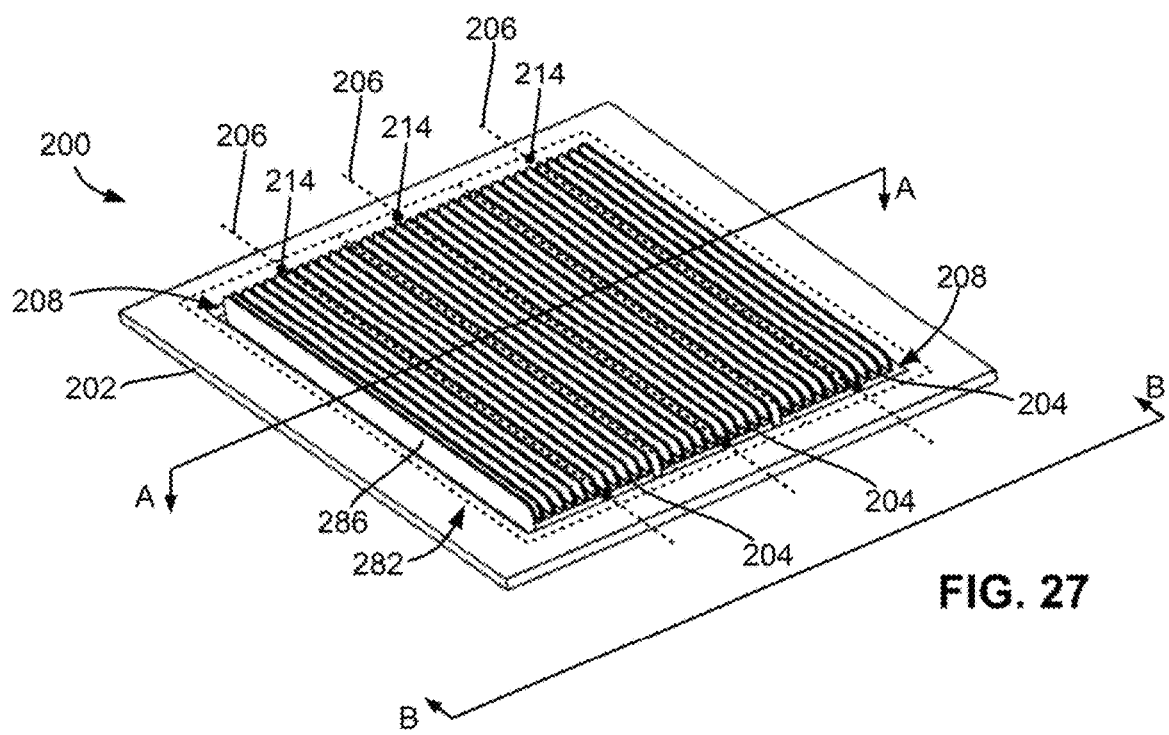
FIG. 27 is a rear-perspective view of the high-power LED light apparatus shown in FIG. 20 in some embodiments.
Figure 28:
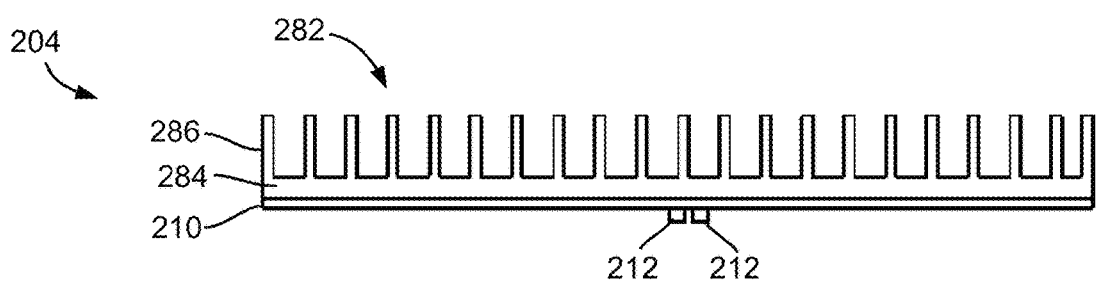
FIG. 28 is a cross-sectional view of the high-power LED light apparatus along the cross-section line A-A shown in FIG. 27.

In some embodiments as shown in FIGS. 27 and 28, each LED panel 204 comprises a heat sink 282 on a rear side thereof. The heat sink 282 is made of a material suitable for heat exchange such as steel, aluminum, and/or the like. The heat sink 282 comprises a base portion 284 coupled to the back of the PCB 210 and a plurality of elongated fins 286 in parallel with the axis 206 of the LED panel 204 and vertically extending from the base portion 284. The base portion 210 of the heat sink 282 is coupled to the back of the PCB 210 by using a thin layer of potting material with high thermal conductivity for a better thermal contact between the PCB 210 and the heat sink 282. The layer of potting material acts as a thermal conductor, a barrier to moisture and water ingression into the PCB 210, and an electrical insulation for the PCB 210.

The heat sink 282 absorbs the heat generated by the electrical components on the PCB 210 and discharges the absorbed heat to the ambient via heat radiation and heat convection. The fins 286 of the heat sink 282 facilitate heat radiation. Moreover, the gaps 208 between adjacent LED panels 204 and between the frame 202 and the LED panels 204 adjacent thereto facilitate heat convection via the airflow therethrough. Therefore, the heat sink 282 significantly facilitates the cooling of the PCB 210 and components thereon.

To assemble the LED light apparatus 200, one may apply a thin layer of potting material with high thermal conductivity to the heat sink 282 and attach the heat sink 282 to the back of the PCB 210 to form a LED panel 204. After all LED panels 204 are formed, a motor 214 is installed on the side of each LED panel 204. Then, the motors 214 and the LED panels 204 are received into the frame 202. The LED light apparatus 200 is assembled after necessary wiring is completed.

Figure 29:
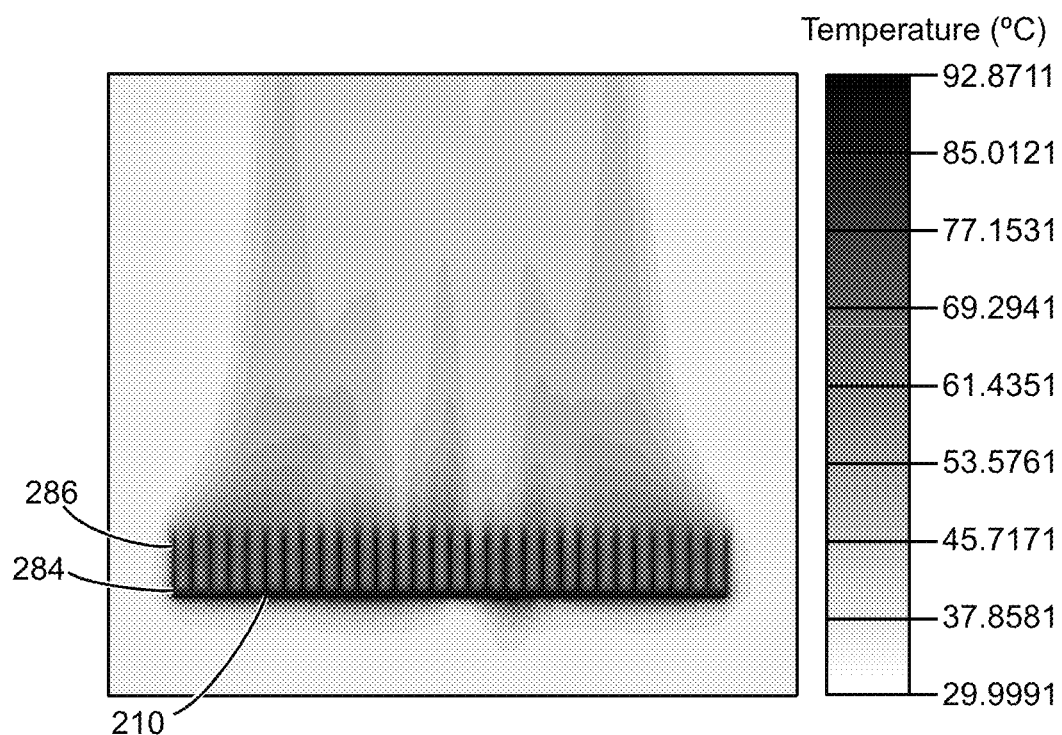
FIG. 29 is a cross-sectional view of the high-power LED light apparatus along the cross-section line A-A shown in FIG. 27 for showing the temperature profile about a PCB of the high-power LED light apparatus when the LED panels of the high-power LED light apparatus are tightly arranged side-by-side and fit into the frame without any gaps.
Figure 30:
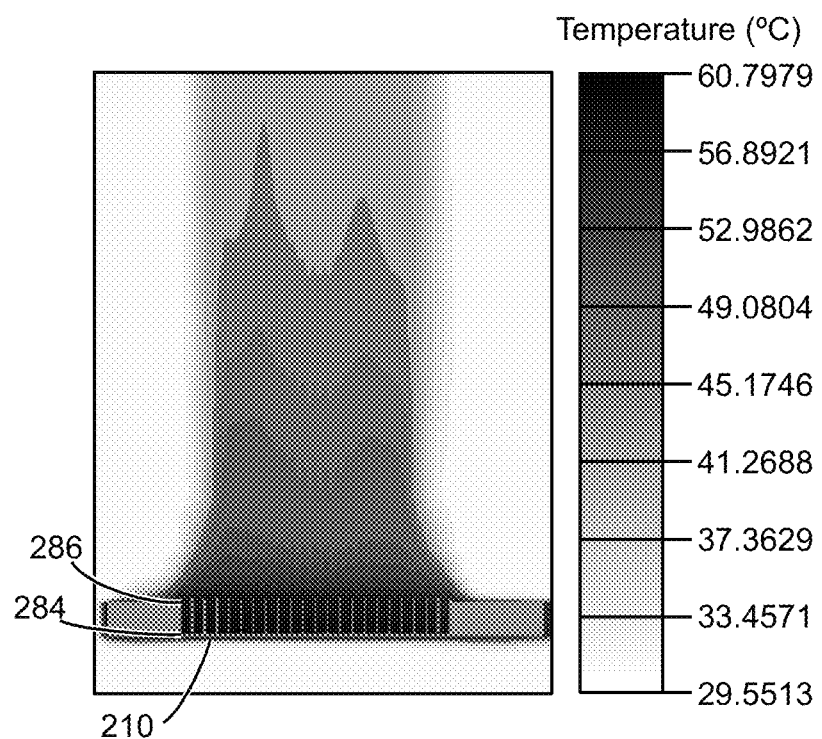
FIG. 30 is a cross-sectional view of the high-power LED light apparatus along the cross-section line A-A shown in FIG. 27 for showing the temperature profile about a PCB of the high-power LED light apparatus when gaps are maintained between adjacent LED panels and between the heat sinks and the LED panels adjacent thereto.
Figure 31:
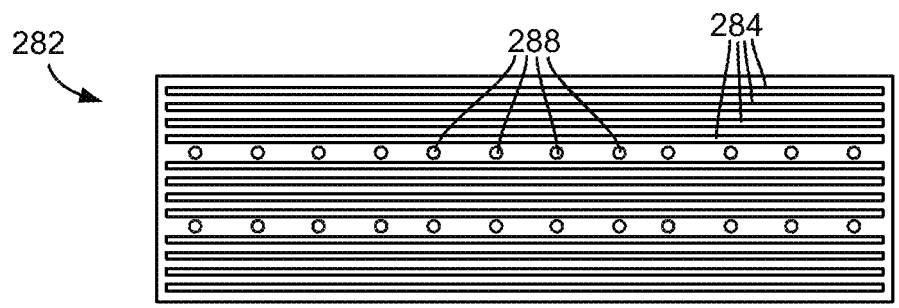
FIG. 31 is a rear view of a heat sink for attaching to the PCB of a LED panel of the high-power LED light apparatus shown in FIG. 20, according to some alternative embodiments of this disclosure.

FIGS. 29 to 31 show the testing results of the thermal performances of the heat sinks 282 in terms of temperature profiles about the PCB 210 for the same heat dissipation with and without the gaps 208 between adjacent LED panels 204 and between the frame 202 and the LED panels 204 adjacent thereto.

FIG. 29 is a cross-sectional view of the LED light apparatus 200 along the cross-section line A-A shown in FIG. 27 for showing the temperature profile about a PCB 210 when the LED panels 204 are tightly arranged side-by-side and fit into the frame 202 without the gaps 208. As shown, the maximum temperature may reach about 93° C. at the fins 286 and the base portion 284.

FIG. 30 is a cross-sectional view of the LED light apparatus 200 along the cross-section line A-A shown in FIG. 27 for showing the temperature profile about a PCB 210 when the gaps 208 are maintained between adjacent LED panels 204 and between the frame 202 and the LED panels 204 adjacent thereto. As can be seen, while the temperature may reach about 61° C. at locations in proximity with the fins 286, the maximum temperature at the fins 286 and the base portion 284 is only about 45° C., thereby clearly indicating that the gaps 208 significantly improve the thermal performance of the heat sink 282.

FIG. 31 is a rear view of a heat sink 282 for attaching to the PCB 210 of a LED panel 204 in some alternative embodiments. The heat sink 282 in these embodiments is similar to that shown in FIG. 27 except that the heat sink 282 in these embodiments further comprises a plurality of openings 288 for further improving heat convection. In some embodiments, the PCB 210 of the LED panel 204 also comprise one or more openings at locations corresponding to the plurality of openings 288 for further improving heat convection as described above.

Figure 32:
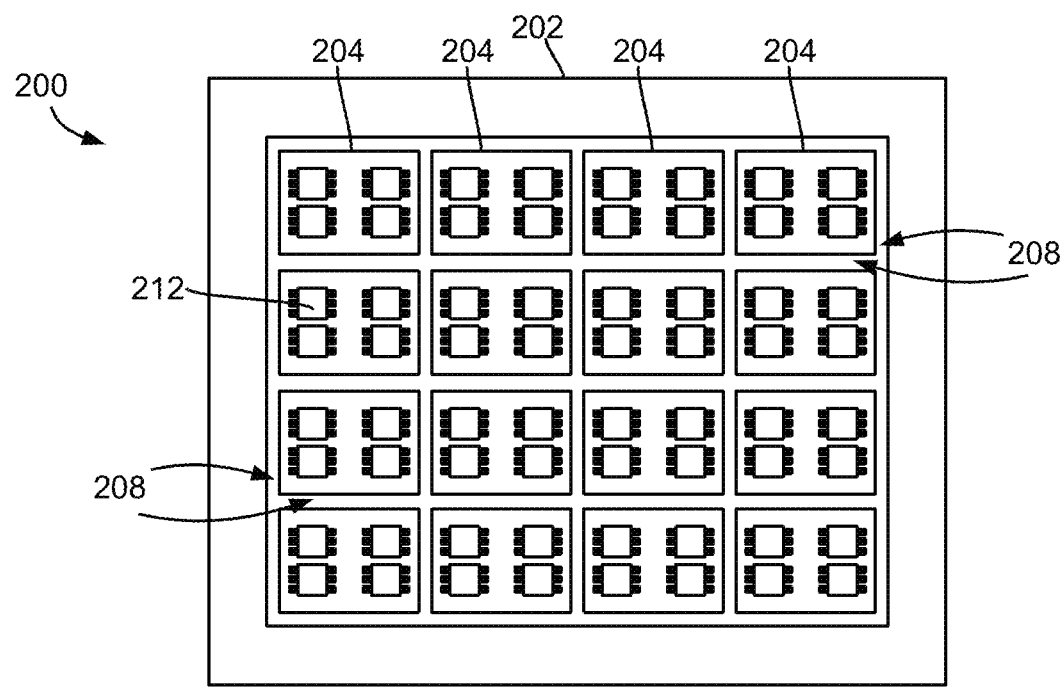
FIG. 32 is a plan view of the high-power LED light apparatus shown in FIG. 20, according to some alternative embodiments of this disclosure, wherein each LED panel of the high-power LED light apparatus is rotatable about two perpendicular axes.

In above embodiments, the LED panels 204 are arranged in a single column and each LED panel 204 is rotatable only about one axis (e.g., the x-axis). In some alternative embodiments as shown in FIG. 32, the LED panels 204 are arranged in a matrix form and received in the frame 202. Each LED panel 204 is controlled by two motors (not shown) and is rotatable about two perpendicular axes (e.g., the x-axis and the y-axis). Similar to the embodiments shown in FIG. 20, gaps 208 are maintained between adjacent LED panels 204 and between the frame 202 and the outermost LED panels 204 for facilitating rotation of LED panels 204 and for facilitating heat convection.

In some alternative embodiments, some LED panels 204 of the LED light apparatus 200 may be rotatable only about one axis (e.g., the x-axis), and some other LED panels 204 thereof may be rotatable about two axes (e.g., the x-axis and the y-axis).

In above embodiments, all LED panels 204 are rotatable. In some embodiments, the LED light apparatus 200 may comprise one or more non-rotatable or stationary LED panels each having one or more LEDs.

Figure 33:
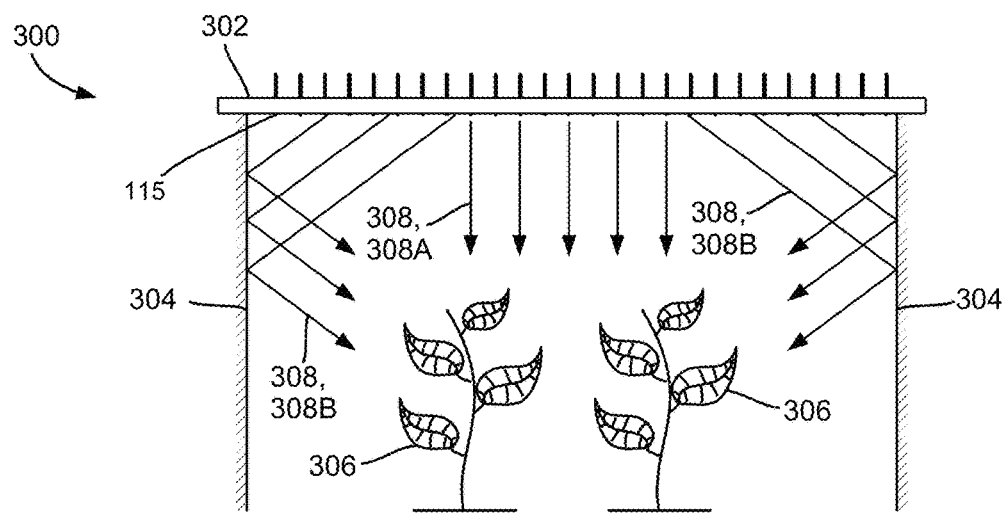
FIG. 33 is a schematic diagram of a LED grow-light system having a LED light source and one or more reflectors, according to some embodiments of this disclosure.

FIG. 33 shows a LED grow-light system 300 according to some embodiments of this disclosure. The LED grow-light system 300 may be preferably used for in-house plant growth although it may also be used for outdoor plant growth.

As shown, the LED grow-light system 300 comprises a LED light source 302 and a plurality of reflective structures or reflectors 304 such as a plurality of mirrors about one or more plants 306.

The LED light source 302 may be conventional LED panels, a controllable LED light source as disclosed in above-described PCT Application No. PCT/CA2018/050522, the above-described LED light apparatus 100 and/or 200, and/or any LED-based light sources suitable for illuminating the plants 306 and used as grow-lights.

Figure 34:
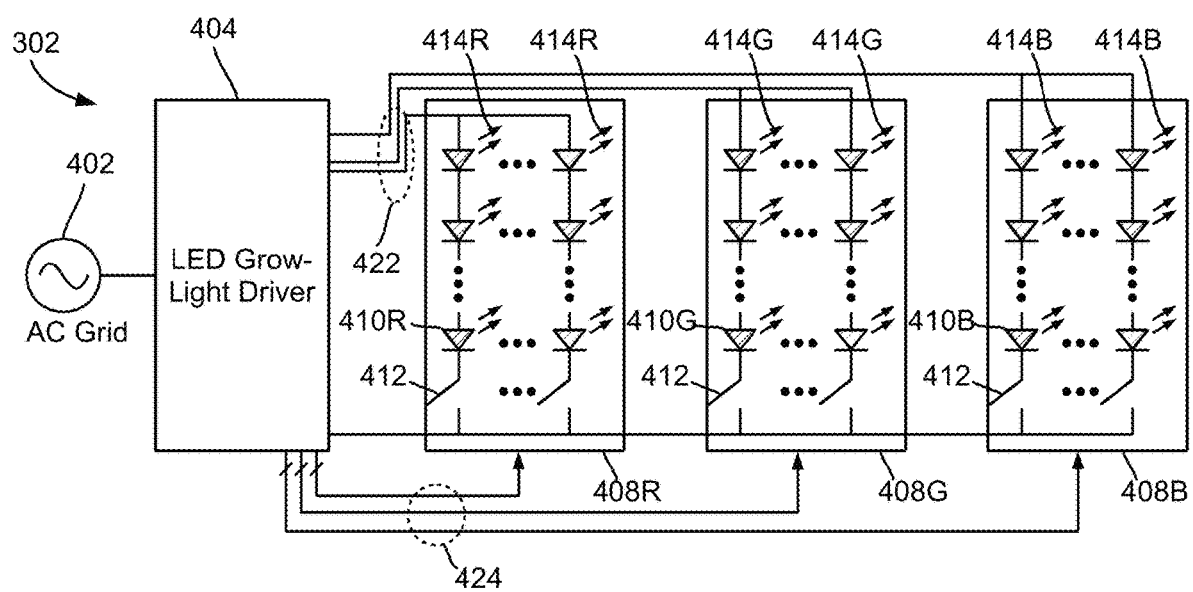
FIG. 34 is a schematic diagram of the LED light source shown in FIG. 33.

For example, FIG. 34 shows a light source 302 in some embodiments. As shown, the light source 302 comprises a power source 402, a LED grow-light driver circuitry 404, and three LED arrays 408R, 408G and 408B for emitting light rays 414R, 414G, and 414B of red, green, and blue light spectra, respectively. Each of the red, green, and blue light rays 414R, 414G, and 414B forms a portion of the light for illuminating the plant 306, and has a subset of the spectrum thereof. Hereinafter, the reference numerals related to light spectra may be used with a suffix "R", "G" or "B" for referring to red, green, or blue spectra, or may be used without any suffix for collectively referring to the referred component. For example, the LED arrays may be referred individually using reference numerals 408R, 408G and 408B, and may be collectively referred using reference numeral 408 for ease of description.

In these embodiments, the power source 402 is an AC power source such as an AC grid. The LED grow-light driver circuitry 404 receives AC power from the power source 402, and converts the received AC power to a DC power for individually driving the LED arrays 408R, 408G and 408B via respective power buses 422. The LED grow-light driver circuitry 404 also controls the light characteristics of the LED arrays 408R, 408G, and 408B via a set of signal lines 424.

Each LED array 408 comprises one or more columns with each column comprising one or more color LEDs 410 and a switch 412, such as a semiconductor switch, connected in series. The LEDs 410 in each LED array 408 emit light of a particular spectrum.

Figure 35:
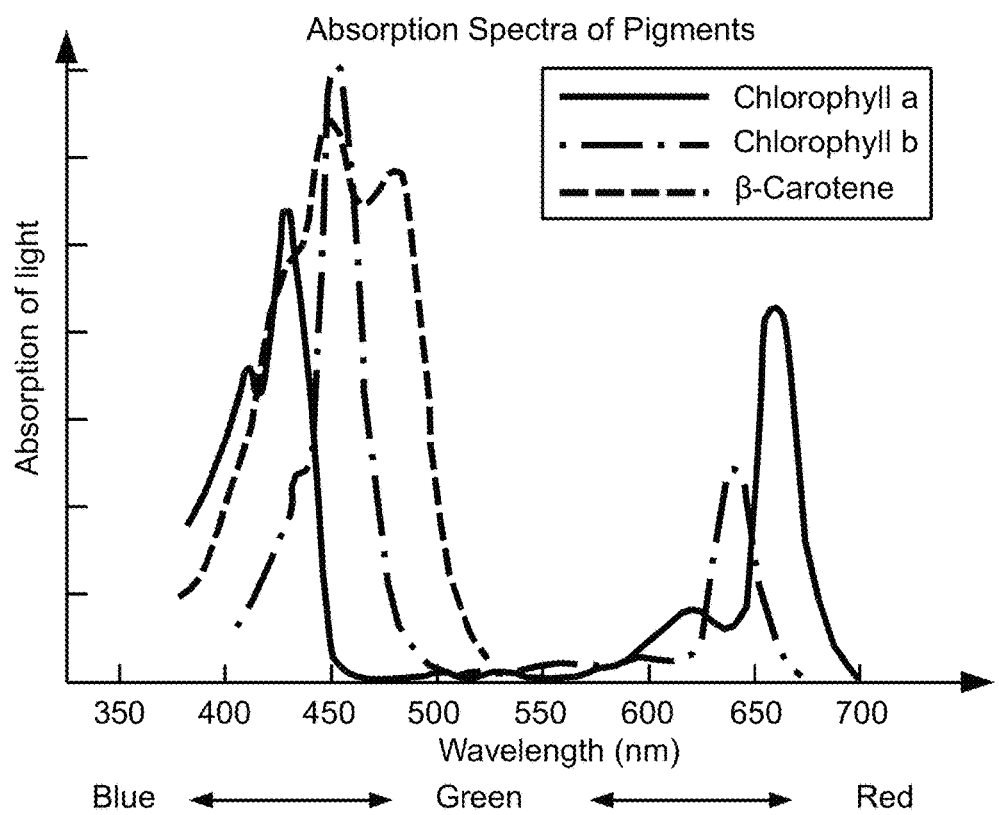
FIG. 35 shows the absorption spectra of three photosynthesis pigments.

As is known in the art, there exist a plurality of key pigments in photosynthesis such as chlorophyll a, chlorophyll b, and β-carotene that absorb light of different spectra. FIG. 35 shows the absorption spectra of the three photosynthesis pigments. As can be seen, chlorophyll a and chlorophyll b mainly absorb blue and red spectra, and β-carotene mainly absorbs blue and green spectra.

Referring back to FIG. 34, each LED array 408 emits a colored light with a spectrum about one or more light absorption peaks of the photosynthesis pigments. For example, in some embodiments, the LEDs 410R of the LED array 408R emit red light with spectra within the range between about 400 nanometers (nm) and about 470 nm, the LEDs 410G of the LED array 408G emit green light with spectra within the range between about 470 nm and about 520 nm, and the LEDs 410B of the LED array 408B emit blue light with spectra within the range between about 620 nm and about 680 nm. In some embodiments, the green-light LED array 408G may comprise fewer LEDs 410G than each of the red-light and the blue-light LED arrays 408R and 408B since the main light spectrum required by plants is usually around red and blue spectra.

The LED grow-light driver circuitry 404 powers each LED array 408 through a separate power bus 422. In each LED array 408, the switch 412 in each column thereof may be controlled by the LED grow-light driver circuitry 404 to turn on or off for adjusting the light intensity thereof.

In some embodiments, the light source 302 may further comprise a light detector (not shown) for monitoring the light reflected from the plants 306 and/or a chlorophyll fluorescence emitted therefrom. As known in the art, the spectra of the reflected light provides information related to the growth of the plants 306 and the health condition thereof (e.g., the photosynthesis efficiency thereof). Therefore, by monitoring the reflected light or the chlorophyll fluorescence, the light detector may provide feedback signals to the LED grow-light driver circuitry 404 to measure the growth of plants 306 and to control the LED arrays 408 accordingly.

Referring again to FIG. 33, the LED light source 302 emits light rays 308 for facilitating the growth of the plants 306. As the light emitted from the LED light source 302 may be divergent, a first portion of the light rays 308A may be emitted towards the plants 306 and a second portion of the light rays 308B may be emitted away from the plants 306. The reflectors 306 are located at suitable locations and at suitable angles to reflect the second portion of the light rays 308B towards the plants 306.

As the reflected second portion of the light rays 308B are from different directions than those of the first portion of the light rays 308A, the reflected second portion of the light rays 308B may illuminate the leaves of the plants 306 that are shaded by other leaves from receiving the first portion of the light rays 308A, and may also illuminate the lower parts of the plants 306.

Therefore, with the use of the reflectors 304, the LED grow-light system 300 may distribute the emitted light about the plants 306 and provide uniform illumination thereto with elimination or at least alleviation of the aforementioned shading issue that may otherwise prevent leaves in shadows or in the lower parts of the plants 306 from receiving sufficient light energy.

Figure 36A:
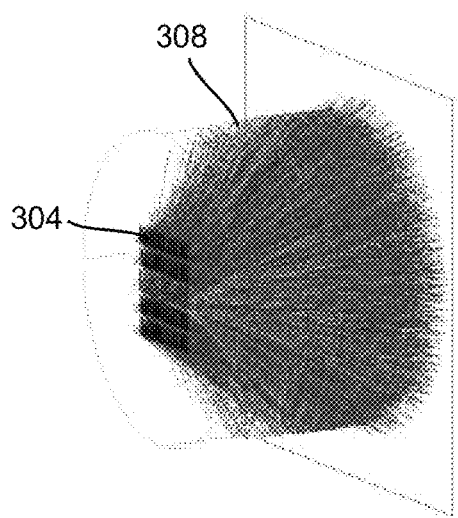
FIG. 36A show the illumination results, obtained using ray-tracing, in a site using the LED light source and the reflectors shown in FIG. 33.

FIGS. 36A to 37C show a comparison of the illumination results, obtained using ray-tracing, in a site using a LED light source 302 with and without the reflectors 304. FIGS. 36A and 36B show the distribution of light rays in the site for the LED light source 302 with and without the reflectors 304, respectively, and FIGS. 37A and 37B show the illumination-intensity distribution in the site for the LED light source 302 with and without the reflectors 304, respectively. FIG. 37C is the legend showing the scale of the illumination-intensity shown in FIGS. 37A and 37B.

Figure 36B:
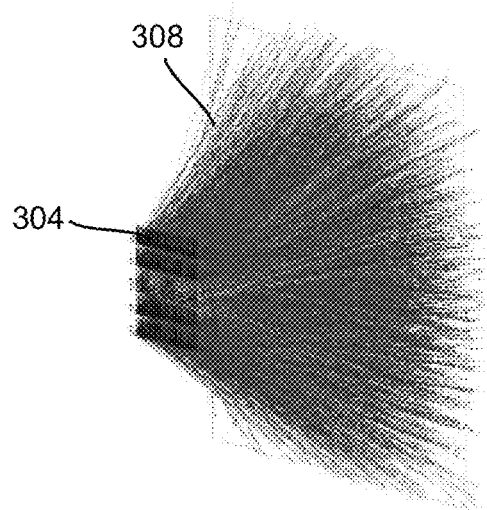
FIG. 36B show the illumination results, obtained using ray-tracing, in a site using a LED light source without reflectors.

As can be seen, the light rays 308 emitted from the light source 302 with the reflectors 304 (see FIGS. 36A and 37A) are confined in the site with a more uniform distribution profile, compared to the more divergent light rays 308 emitted from the light source 302 without the reflectors (see FIGS. 36B and 37B).

It has been recently discovered that plants channel light to their roots through their stems that act like fiber-optic cables (see Reference 2). Inspired from this intelligence of evolution, FIG. 38 shows a LED grow-light system 300 using fiber-optic cables for light distribution, according to some embodiments of this disclosure. The LED grow-light system 300 may be preferably used for in-house plant growth although it may also be used for outdoor plant growth.

As shown, the LED grow-light system 300 comprises a LED light source 302 and a plurality of fiber-optic cables 502 for distributing light rays 308B towards one or more plants 306.

In this example, the LED light source 302 is configured for illuminating the plants 306 substantively from thereabove. A first set of one or more LEDs 504A in a central area of the LED light source 302 are exposed to the plants 306 for emitting light rays 308A directly thereto. On the other hand, a second set of one or more LEDs 504B in a peripheral area of the LED light source 302 are optically coupled to the proximal ends of the fiber-optic cables 502 via respective fiber-optic couplings 508. One or more cable holders 510 are used for mounting the fiber-optic couplings 508 to the LED light source 302. The fiber-optic cables 502 are arranged to position the distal ends thereof at different locations about and/or in proximity with leaves and stems of the plants 306 and at different directions as needed.

In these embodiments, the coupling between the LEDs 504B and the fiber-optic couplings 508 may be in any suitable manner such as one-to-one (i.e., one LED 504B coupled to one fiber-optic coupling 508 and thus to one fiber-optic cable 502), many-to-one (i.e., a plurality of LEDs 504B coupled to one fiber-optic coupling 508 and thus to one fiber-optic cable 502), one-to-many (i.e., one LED 504B coupled to a plurality of fiber-optic couplings 508 and thus to a plurality of fiber-optic cables 502), and/or many-to-many (i.e., a plurality of LEDs 504B coupled to a plurality of fiber-optic couplings 508 and thus to a plurality of fiber-optic cables 502). Efficient coupling of LED light into fiber-optic cables may be achieved by using large-core optic fibers with high numerical apertures or by using such large-core optic fibers in combination with a lens system to obtain high coupling-efficiency.

In operation, the first set of LEDs 504A in the central area of the LED light source 302 emit light rays 308A directly towards the plants 306. The fiber-optic cables 502 direct the light rays 308B emitted from the second set of LEDs 504B in the peripheral area of the LED light source 302 towards the leaves and stems of the plants 306, thereby eliminating or at least alleviating the aforementioned shading issue that may otherwise prevent leaves in shadows or in the lower parts of the plants from receiving sufficient light energy.

Moreover, the LED grow-light system 300, and more specifically the LED grow-light driver circuitry 404 thereof (see FIG. 34) may adjust the illumination parameters (e.g., light intensities) of one or more of the first and second sets of LEDs 504A and 504B to optimize the physiological processes of growing plants.

The LED grow-light system 300 in these embodiments thus enables a variety of applications that may be otherwise difficult to implement using conventional techniques. For example, the LED grow-light system 300 and more specifically the fiber-optic cables 502 thereof may be arranged to deliver light with suitable wavelength and intensity to specific target areas of the plants 306 for treating unhealthy parts thereof.

It is known that artificial light may be used for pest and disease control of plants and may reduce the need for synthetic pesticide (see Reference 3). In some embodiments, the LED grow-light system 300 shown in FIG. 38 and more specifically the fiber-optic cables 502 thereof may be used for distributing light with suitable wavelength and intensity to specific target areas of the plants 306 for insects and pests control, thereby leading to a step towards organic and biodynamic farming.

Although in the embodiments shown in FIG. 38, the first set of LEDs 504A in the central area of the LED light source 302 are not coupled to any fiber-optic cables, in some embodiments, all LEDs 504A and 504B of the LED light source 302 are coupled to fiber-optic cables 502.

In the embodiments shown in FIG. 38, the fiber-optic cables 502 of the LED grow-light system 300 deliver light from the LED light source 302 to the plant 306. In some alternative embodiments, the fiber-optic cables 502 may be also used for delivering light from the plant 306 (or more particularly, specific target areas of the plant 306) to one or more imaging devices (not shown) of the LED grow-light system 300 for capturing images of the specific target areas of the plant 306 for examining the growth or health of the plant 306.

Figure 39:
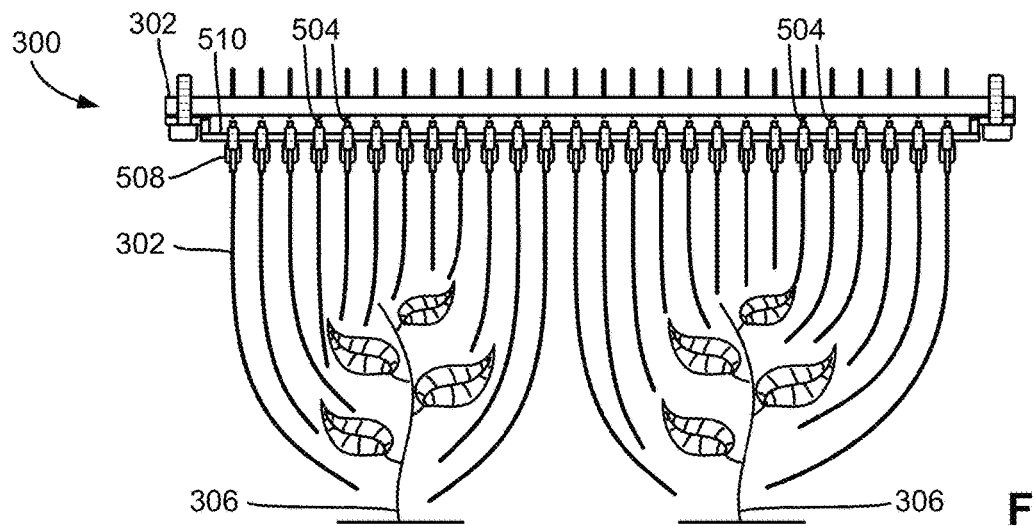
FIG. 39 is a schematic diagram of a LED grow-light system having a LED light source and a plurality of diffusive fiber-optic cables, according to some embodiments of this disclosure.

FIG. 39 shows a LED grow-light system 300 using diffusive fiber-optic cables for light distribution, according to some embodiments of this disclosure. The LED grow-light system 300 may be preferably used for in-house plant growth although it may also be used for outdoor plant growth.

The LED grow-light system 300 in these embodiments is similar to that shown in FIG. 38. In particular, at least some of the LEDs 504 are coupled to the fiber-optic cables 502 with the distal ends of the fiber-optic cables 502 distributed about various components (e.g., leaves and/or stems) of the one or more plants 306.

Figure 40A:
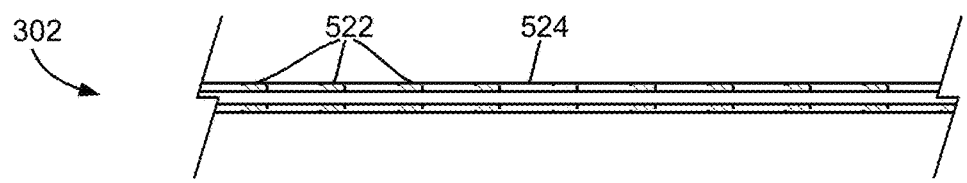
FIG. 40A is a schematic diagram of a diffusive fiber-optic cable shown in FIG. 39.

As shown in FIG. 40A, in these embodiments, each fiber-optic cable 502 is a diffusive fiber-optic cord with a plurality of diffusive areas 522 distributed therealong and spaced by non-diffusive areas 524.

Figure 40B:
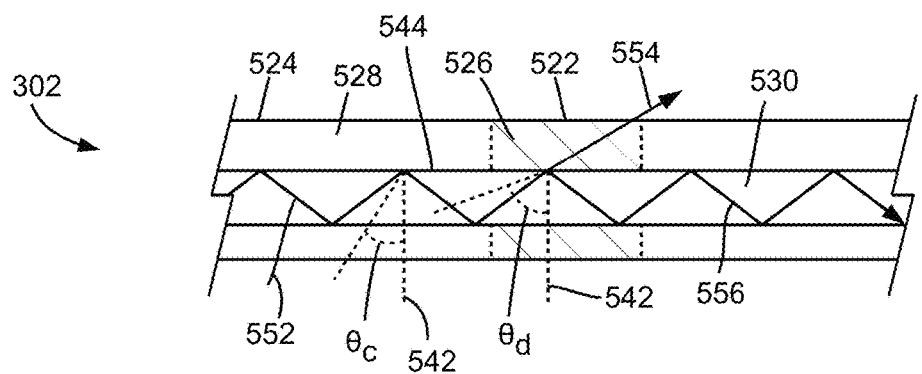
FIG. 40B is a schematic diagram showing an enlarged portion of the diffusive fiber-optic cable shown in FIG. 40A.

As shown in FIG. 40B, in each diffusive area 522, the refractive index $n_d$ of the cladding 526 therein is greater than the refractive index $n_o$ of the cladding 528 in the non-diffusive area 524 and is smaller than the refractive index $n_o$ of the core 530, i.e., $n_o > n_d > n_c$, such that the critical angle $\theta_d$ of the diffusive area 522 (defined as the angle with respect to the norm 542 perpendicular to the interface 544 between the cladding 526 and the core 530) is greater than the critical angle $\theta_c$ of the non-diffusive area 524, i.e., $$\theta_d = \arcsin\frac{n_d}{n_o} > \theta_c = \arcsin\frac{n_c}{n_o}.$$

When a light 552 is incident into the fiber-optic cable 502 at an angle greater than the critical angle $\theta_c$ of the non-diffusive area 524 and travels therein, the light 552 is fully reflected in the non-diffusive area 524 because of the total internal reflection. When the light 552 travels in a diffusive area 522, a portion 554 of the light 552 is refracted through the cladding 526 and escapes the fiber-optic cable 502 which in these embodiments is then used for illuminating the plants. Another portion 556 of the light 552 is reflected at the interface 544 to travel further in the fiber-optic cable 502 and may be partially diffused out of the fiber-optic cable 502 at the next diffusive area 522.

In this manner, the LED grow-light system 300 may distribute light to various parts of the plants 306, and may be used in various applications as described above.

In the embodiments shown in FIGS. 20 to 27, the LED light apparatus 200 a plurality of LED panels 204 rotatably mounted to the frame 202 to allow adjustments of the operation of the LED light apparatus 200 such as the light distribution, light angular-span, and light direction thereof. Thus, the LEDs 212 on each LED panel 204 are controlled as a group in the adjustments of the light-emission angle thereof.

Figure 41:
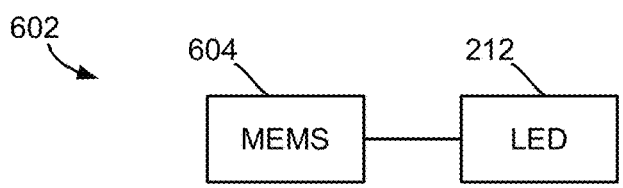
FIG. 41 is a schematic diagram showing a LED assembly comprising a LED rotatably coupled to a microelectromechanical-structure (MEMS) component.

In some embodiments, the light direction or light-emission angle of each LED 212 may be individually controlled. For example, as shown in FIG. 41, a LED assembly 602 may comprise a LED 212 rotatably coupled to a microelectro-mechanical-structure (MEMS) component 604 such that the MEMS component, in response to suitable electrical signal, controls the light-emission angle of the LED 212 coupled thereto for adjusting the light direction of the LED 212.

Referring back to FIG. 20, the LED panels 204 may each comprise one or more LED assemblies 602 such that the light angle and the light angular-span of each LED panel 204 may be more precisely controlled by the light-emission angle of each LED assembly 604. Of course, each LED panel 204 may also comprise one or more LEDs not coupled to or associated with any MEMS components.

As those skilled in the art will appreciate, the LED panels 204 may be non-rotatable in some related embodiments, or may be rotatable in some other related embodiments for achieving, e.g., large light-angle adjustment range.

In some embodiments, the LED assemblies 602 may be printed onto each LED panel 204 thereby significantly simplifying the manufacturing process.

Although embodiments have been described above with reference to the accompanying drawings, those of skill in the art will appreciate that variations and modifications may be made without departing from the scope thereof as defined by the appended claims.

REFERENCES

1. C. E. Farrior, S. A. Bohlman, S. Hubbell, and S. W. Pacala, "Dominance of the suppressed: Power-law size structure in tropical forests," Science 351(6269), 155-157 (2016).
2. H. J. Lee, et al, "Stem-piped light activates phytochromoe B to trigger light responses in Arabidopsis roots," Sci. Signal. 9(452), ra106 (2016).
3. I. Vanninen, D. Pinto, A. Nissinen, N. S. Johansen, L. Shipp, "Prospecting the use of artificial lighting for integrated pest management," ISHS Acta Horticulture 956: International Symposium on Light in Horticultural Systems (2012).

What is claimed is:

1. A method for dissipating heat generated from at least one printed circuit board (PCB) received in a housing of a lighting apparatus during operation, the method comprising:
   establishing one or more first openings on the at least one PCB; and
   establishing one or more second openings on the housing and a plurality of spaced fins extending rearwardly from a rear side of the housing and extending continuously from one side of the one or more second openings over the one or more second openings to an opposite side of the one or more second openings such that the one or more first openings, the one or more second openings, and spaces between the plurality of spaced fins form a straight air path through the at least first PCB for dissipating the heat generated from the at least first PCB;
   wherein said arranging the plurality of fins on the rear-wall structure and equidistantly spaced apart from each other comprises:
   arranging a first set of the plurality of fins extend between an opposite pair of edges of the rear-wall structure; and
   arranging a second set of the plurality of fins extend front an outermost fin of the first set of the plurality of fins towards an edge of the rear-wall structure adjacent the outermost fin.

2. The method of claim 1, wherein said establishing the one or more second openings on the housing comprises:
   establishing the one or more second openings on a rear-wall structure on a rear side of the housing.

3. The method of claim 2 further comprising:
   arranging the plurality of fins on the rear-wall structure and equidistantly spaced apart from each other.

4. The method of claim 3, wherein said arranging the plurality of fins on the rear-wall structure and equidistantly spaced apart from each other comprises:
   establishing the one or more second openings on a base of the rear-wall structure; and
   extending the plurality of fins rearwardly from the base of the rear-wall structure.

5. The method of claim 4, wherein said establishing the one or more second openings on the base of the rear-wall structure comprises:
   establishing the one or more second openings on the base of the rear-wall structure at locations corresponding to the one or more first openings.

6. The method of claim 5, wherein said establishing one or more second openings on the housing comprises:
   arranging the plurality of fins on the rear-wall structure and equidistantly spaced apart from each other with the spaces between the plurality of fins forming the one or more second openings.

7. The method of claim 2, wherein the rear-wall structure is made of a thermal-conductive material, and the method further comprising:
   arranging the at least one PCB in thermal contact with the rear-wall structure.

8. The method of claim 7, wherein said arranging the at least one PCB in thermal contact with the rear-wall structure comprises:
   sandwiching a layer of thermal-conductive potting material between the at least one PCB and the rear-wall structure.

9. The method of claim 2, wherein said establishing the one or more second openings on the rear-wall structure of the housing comprises:
   establishing the one or more second openings on the rear-wall structure of the housing with at least a pair of one of the one or more first openings and one of the one or more second openings overlapped at a vertical direction.

10. The method of claim 1 further comprising:
    establishing one or more third openings on a front wall of the housing for collaborating with the one or more first openings and the one or more second openings for dissipating the heat.

11. The method of claim 10, wherein said establishing the one or more third openings on the front wall of the housing comprises:
    establishing the one or more elongated third openings on the front wall of the housing.

12. The method of claim 1 further comprising:
    distributing one or more light-emitting components on the at least one PCB about the one or more first openings.

13. The method of claim 1, wherein said establishing the one or more first openings on the at least one PCB comprises:
    establishing the one or more elongated first openings on the at least one PCB.

14. The method of claim 1 further comprising:
    coating the at least one PCB with a conformal coating layer on an exterior side thereof.

15. The method of claim 1, wherein said establishing the one or more second openings and the plurality of fins extending over the one or more second openings on the housing comprises:
    establishing the one or more second openings and the plurality of fins extending from one side of the housing over the one or more second openings on the housing to an opposite side of the housing for collaborating with the or more first openings for dissipating heat via heat convection.

16. A lighting apparatus comprising:
    at least a first printed circuit board (PCB) comprising one or more first openings; and
    a housing receiving the at least first PCB therein;
    wherein the housing comprises a rear-wall structure on a rear side of the at least first PCB, the rear-wall structure comprising one or more second openings and a plurality of spaced fins extending rearwardly from the rear side of the rear-wall structure and extending continuously from one side of the one or more second openings over the one or more second openings to an opposite side of the one or more second openings such that the one or more first openings, the one or more second openings, and spaces between the plurality of spaced fins form a straight air path through the at least first PCB for dissipating heat generated from the at least first PCB; and
    wherein a first set of the plurality of fins extend between an opposite pair of edges of the rear-wall structure and over the one or more second openings; and wherein a second set of the plurality of fins extend from an outermost fin of the first set of the plurality of fins towards an edge of the rear-wall structure adjacent the outermost fin.

17. The apparatus of claim 16, wherein the housing comprises a first portion for receiving the at least first PCB, and a second portion; and
    wherein the second portion of the housing has a depth larger than that of the first portion thereof.

18. The apparatus of claim 17, wherein the second portion of the housing receives therein at least a second PCB.

19. The apparatus of claim 18, wherein the at least second PCB comprises one or more fourth openings.

20. The apparatus of claim 17, wherein the housing comprises one or more fifth openings in the second portion.

21. The apparatus of claim 16, wherein the housing comprises a front wall for enclosing the at least first PCB therebehind; and wherein the front wall comprises one or more third openings for dissipating the heat.

22. The apparatus of claim 21, wherein the front wall comprises a lens structure having one or more lenses.

23. The apparatus of claim 21, wherein the one or more third openings are elongated openings.

24. The apparatus of claim 16, wherein the rear-wall structure further comprises a thermal-conductive base; wherein the plurality of fins extend rearwardly from the rear side of the base; and wherein the base comprises the one or more second openings.

25. The apparatus of claim 24, wherein the one or more second openings are at locations corresponding to the one or more first openings.

26. The apparatus of claim 16,
    wherein one or more light-emitting components are distributed on the at least first PCB about the one or more first openings.

27. The apparatus of claim 16, wherein the one or more first openings are elongated openings.

28. The apparatus of claim 16, wherein the straight air path extends along a vertical direction.

29. The apparatus of claim 16, wherein the rear-wall structure is made of a thermal-conductive material.

30. The apparatus of claim 16, wherein the at least first PCB is in thermal contact with the rear-wall structure.

31. The apparatus of claim 16, wherein the at least first PCB is in thermal contact with the rear-wall structure via a layer of thermal-conductive potting material sandwiched therebetween.

32. The apparatus of claim 16, wherein the spaces between the plurality of fins form the one or more second openings.

33. The apparatus of claim 16, wherein the at least first PCB comprises a conformal coating layer on an exterior side thereof.

34. A lighting apparatus comprising:
a housing; and
at least one printed circuit board (PCB) received in the housing;
wherein the at least one PCB comprises one or more first openings and one or more light-emitting components distributed on a front side thereof about the one or more first openings;
wherein the housing comprises a rear-wall structure on a rear side of the at least one PCB, the rear-wall structure comprising one or more second openings and a plurality of spaced fins extending rearwardly from the rear side of the rear-wall structure and extending continuously from one side of the one or more second openings over the one or more second openings to an opposite side of the one or more second openings such that the one or more first openings, the one or more second openings, and spaces between the plurality of spaced fins form a straight air path through the at least first PCB for dissipating heat generated from the at least first PCB; and
wherein a first set of the plurality of fins extend between an opposite pair of edges of the rear-wall structure and over the one or more second openings; and wherein a second set of the plurality of fins extend from an outermost fin of the first set of the plurality of fins towards an edge of the rear-wall structure adjacent the outermost fin.

35. The apparatus of claim 34, wherein the one or more first openings are elongated openings.

36. The apparatus of claim 34, wherein at least a pair of one of the one or more first openings and one of the one or more second openings are overlapped at a vertical direction.

37. The apparatus of claim 34, wherein a back of at least one of the at least one PCB is in thermal contact with the rear-wall structure of the housing.

38. The apparatus of claim 34, wherein the rear-wall structure further comprises a thermal-conductive base; wherein the plurality of fins extend rearwardly from the rear side of the base; and wherein the base comprises the one or more second openings.

39. The apparatus of claim 34, wherein the spaces between the plurality of fins form the one or more second openings.

* * * * *